(12) United States Patent
Fang et al.

(10) Patent No.: US 10,096,596 B2
(45) Date of Patent: Oct. 9, 2018

(54) SEMICONDUCTOR DEVICE STRUCTURE HAVING A PLURALITY OF GATE STRUCTURES

(71) Applicant: TAIWAN SEMICONDUCTOR MANUFACTURING CO., LTD., Hsinchu (TW)

(72) Inventors: Cong-Min Fang, Hsinchu (TW); Chih-Lin Wang, Zhubei (TW); Kang-Min Kuo, Zhubei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 64 days.

(21) Appl. No.: 14/970,036

(22) Filed: Dec. 15, 2015

(65) Prior Publication Data

US 2017/0170170 A1  Jun. 15, 2017

(51) Int. Cl.

| | |
|---|---|
| *H01L 21/3213* | (2006.01) |
| *H01L 21/8234* | (2006.01) |
| *H01L 27/088* | (2006.01) |
| *H01L 27/02* | (2006.01) |
| *H01L 29/49* | (2006.01) |
| *H01L 29/66* | (2006.01) |

(52) U.S. Cl.
CPC ...... *H01L 27/088* (2013.01); *H01L 21/32139* (2013.01); *H01L 21/823456* (2013.01); *H01L 27/0207* (2013.01); *H01L 29/4916* (2013.01); *H01L 29/66545* (2013.01)

(58) Field of Classification Search
CPC ..... H01L 21/823462; H01L 21/823857; H01L 27/11; H01L 27/088; H01L 27/105; H01L 29/0657; H01L 23/3672; H01L 23/3738; H01L 23/427; H01L 23/4275
See application file for complete search history.

(56) References Cited

U.S. PATENT DOCUMENTS

| | | | |
|---|---|---|---|
| 6,509,232 B1 * | 1/2003 | Kim | H01L 27/105 257/E21.685 |
| 7,230,270 B2 | 6/2007 | Chen et al. | |
| 8,304,831 B2 | 11/2012 | Zhu et al. | |
| 2004/0023478 A1 * | 2/2004 | Samavedam | H01L 21/823814 438/592 |
| 2006/0166424 A1 * | 7/2006 | Schaeffer, III | H01L 21/823835 438/199 |
| 2008/0001178 A1 * | 1/2008 | Gehring | H01L 21/823412 257/213 |

(Continued)

*Primary Examiner* — Moazzam Hossain
*Assistant Examiner* — Long H Le
(74) *Attorney, Agent, or Firm* — Haynes and Boone, LLP

(57) ABSTRACT

A semiconductor device structure is provided. The semiconductor device structure includes a substrate having a first source region, a second source region, a first drain region, and a second drain region. The semiconductor device structure includes a first gate structure over the substrate and between the first source region and the first drain region. The semiconductor device structure includes a second gate structure over the substrate and between the second source region and the second drain region. A first thickness of the first gate structure is greater than a second thickness of the second gate structure. A first gate width of the first gate structure is less than a second gate width of the second gate structure.

19 Claims, 43 Drawing Sheets

(56) References Cited

U.S. PATENT DOCUMENTS

| | | | |
|---|---|---|---|
| 2010/0062575 A1* | 3/2010 | Kinoshita | H01L 21/28097 438/199 |
| 2010/0139904 A1* | 6/2010 | Chiba | H01L 21/4878 165/185 |
| 2010/0187683 A1* | 7/2010 | Bakir | H01L 23/3677 257/713 |
| 2014/0131809 A1* | 5/2014 | Ando | H01L 21/02697 257/369 |
| 2014/0227869 A1* | 8/2014 | Reimer | H01L 29/401 438/595 |
| 2014/0256135 A1* | 9/2014 | Javorka | H01L 29/6653 438/694 |

* cited by examiner

SEMICONDUCTOR DEVICE STRUCTURE HAVING A PLURALITY OF GATE STRUCTURES

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography to form circuit components and elements.

One of the important drivers for increased performance in semiconductor devices is the higher levels of integration of circuits. This is accomplished by miniaturizing or shrinking device sizes on a given chip. Tolerance plays an important role in being able to shrink the dimensions of a chip.

However, although existing manufacturing processes for forming semiconductor devices have been generally adequate for their intended purposes, as device scaling-down continues, they have not been entirely satisfactory in all respects.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIGS. 1A-1J are top views of various stages of a process for forming a semiconductor device structure, in accordance with some embodiments.

FIGS. 1A-1 to 1J-1 are cross-sectional views illustrating a semiconductor device structure along a sectional line I-I' in FIGS. 1A-1J respectively, in accordance with some embodiments.

FIGS. 1C-2 to 1D-2 are cross-sectional views illustrating a semiconductor device structure along a sectional line II-II' in FIGS. 1C-1D respectively, in accordance with some embodiments.

FIGS. 1C-3 to 1D-3 are cross-sectional views illustrating a semiconductor device structure along a sectional line III-III' in FIGS. 1C-1D respectively, in accordance with some embodiments.

FIGS. 3A-1 to 3H-1 are cross-sectional views illustrating a semiconductor device structure along a sectional line I-I' in FIGS. 3A-3H respectively, in accordance with some embodiments.

DETAILED DESCRIPTION

Figure 1A:
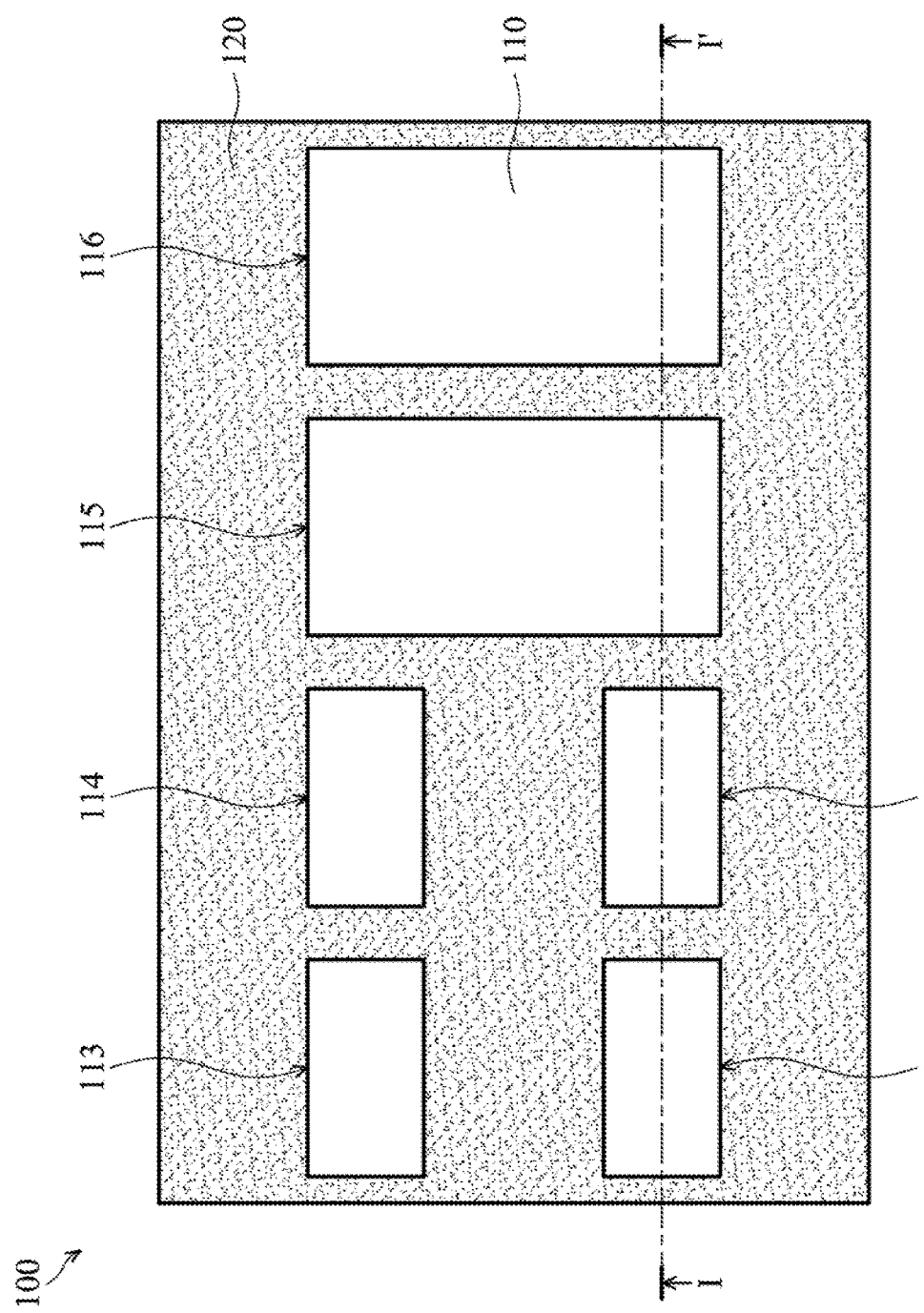

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Figures 1, 1A:
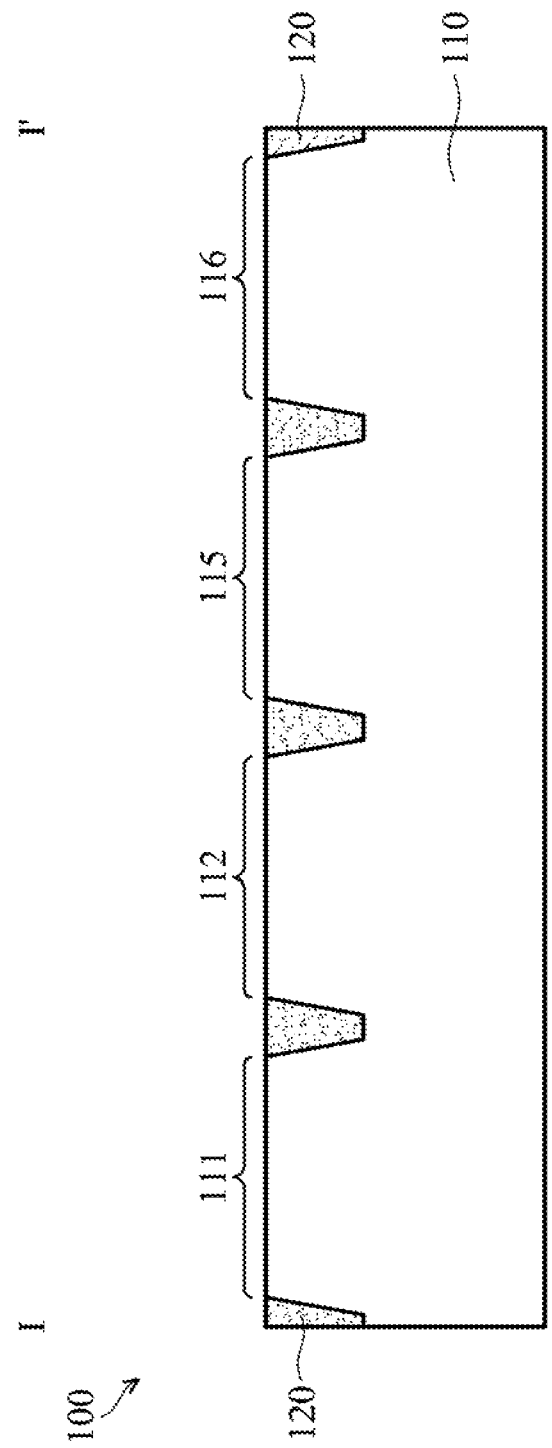
Figure 1B:
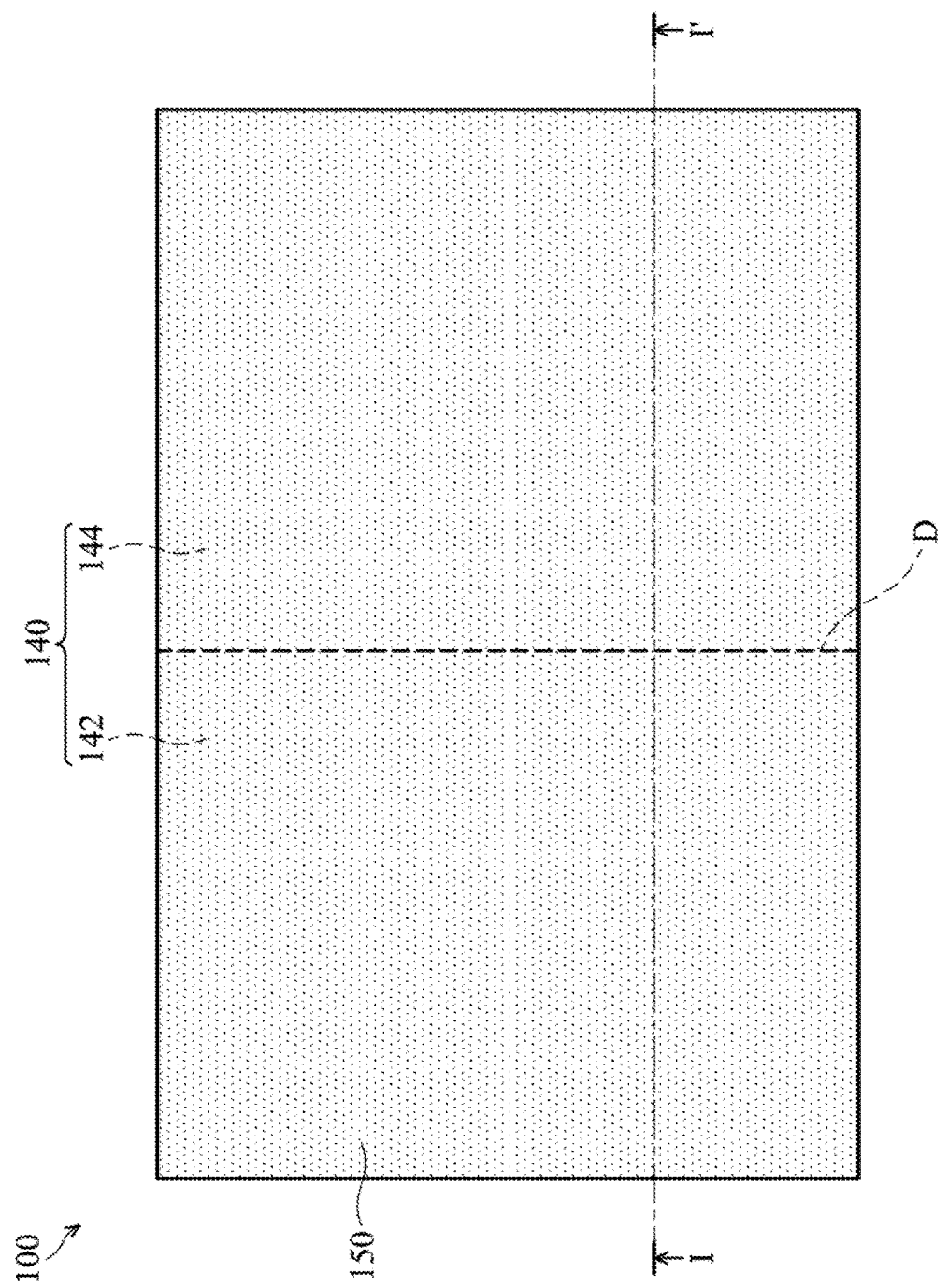
Figures 1, 1B:
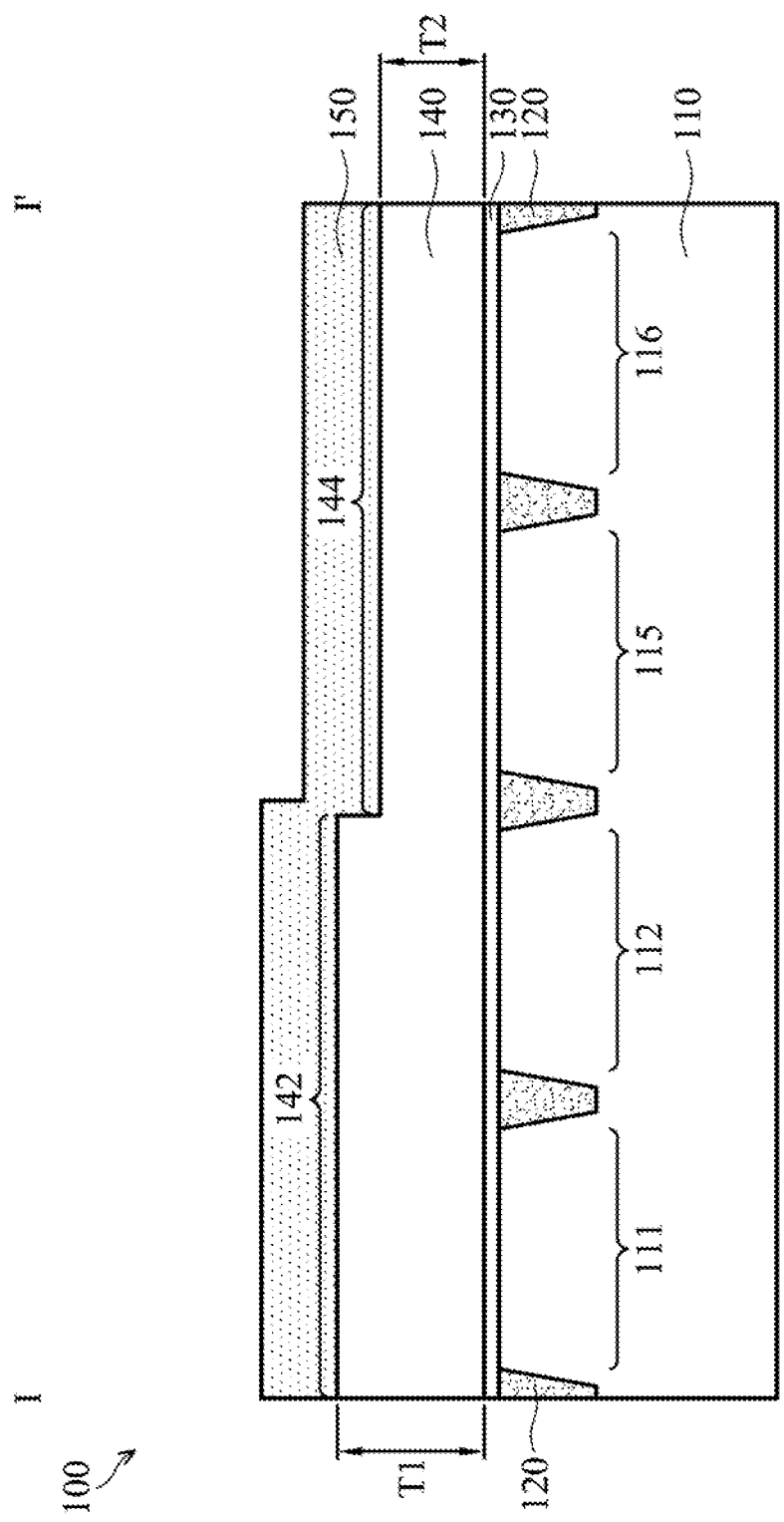
Figure 1C:
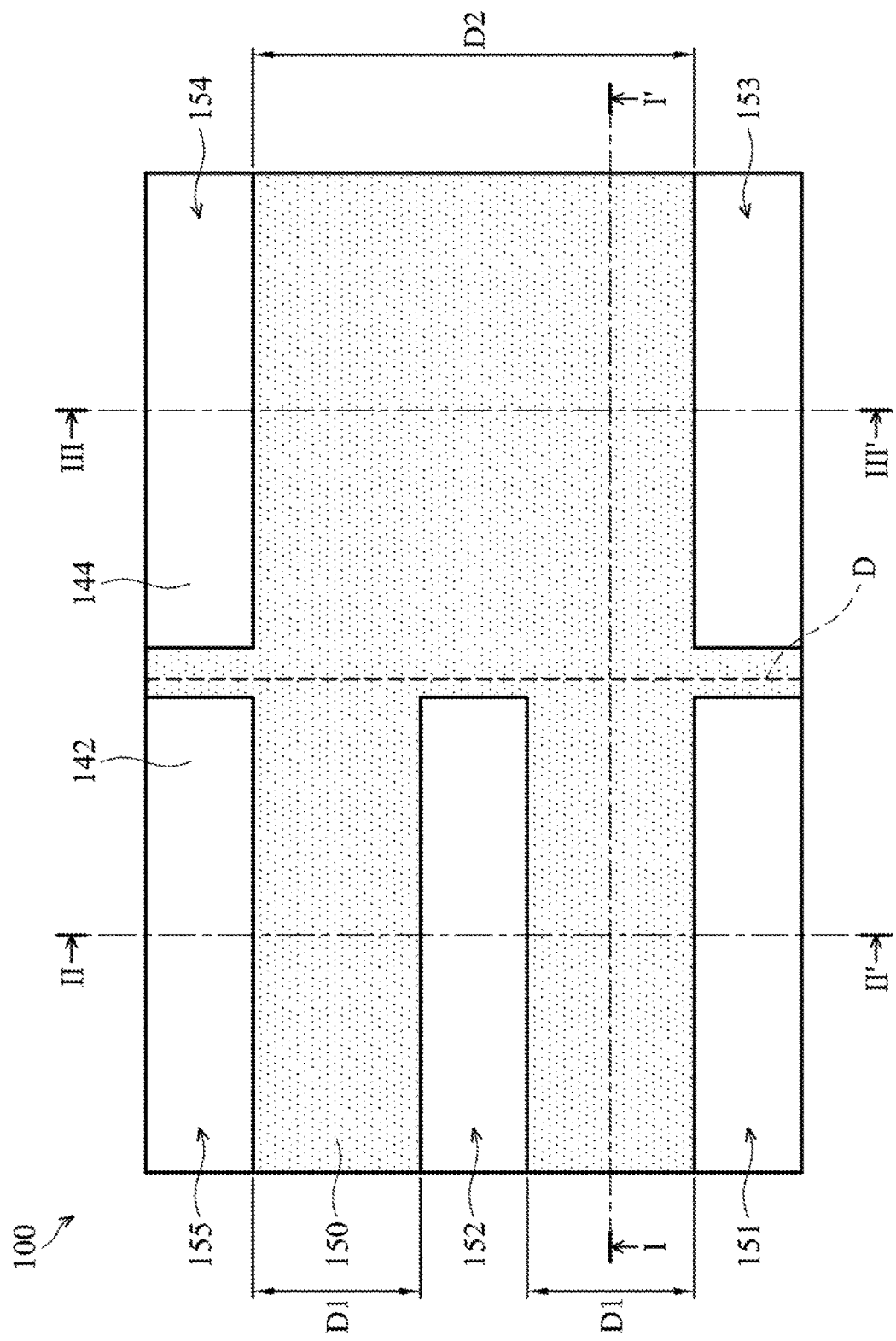
Figures 1, 1C:
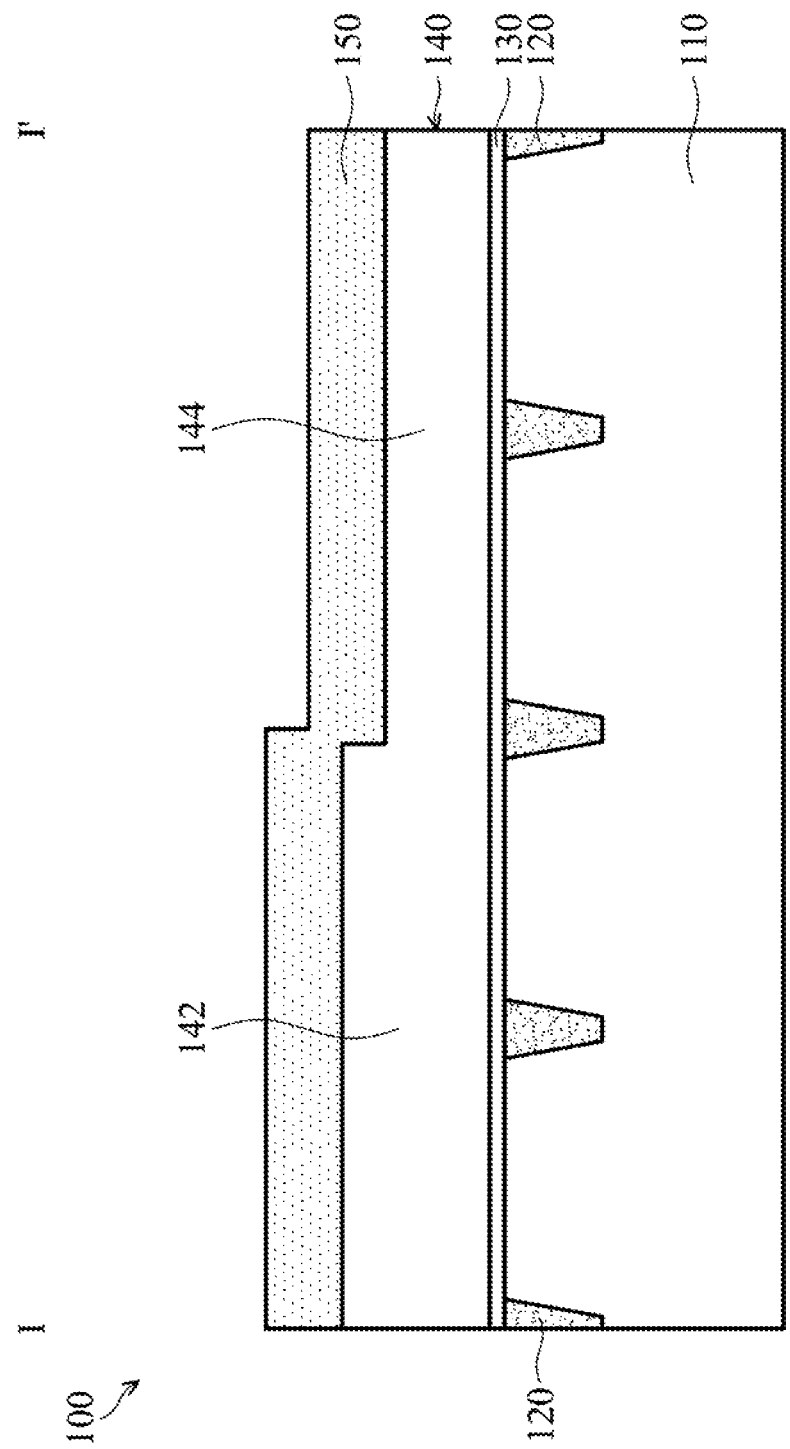
Figures 1, 1C, 2:
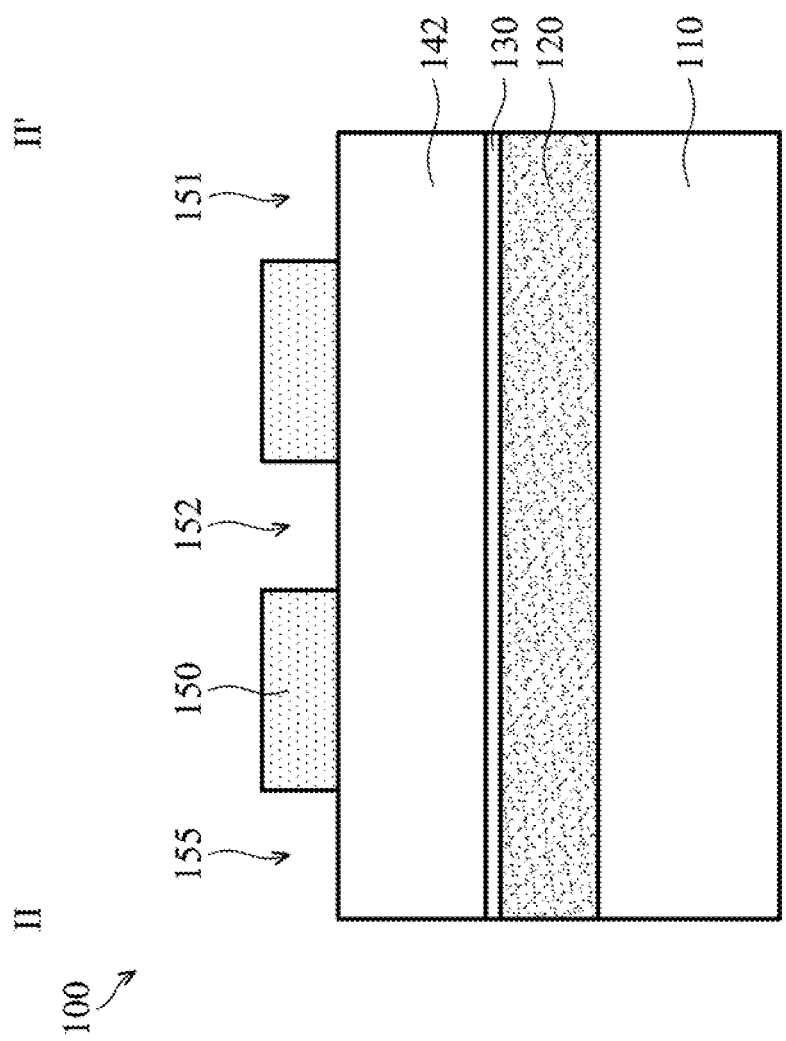
Figures 1, 1C, 2, 3:
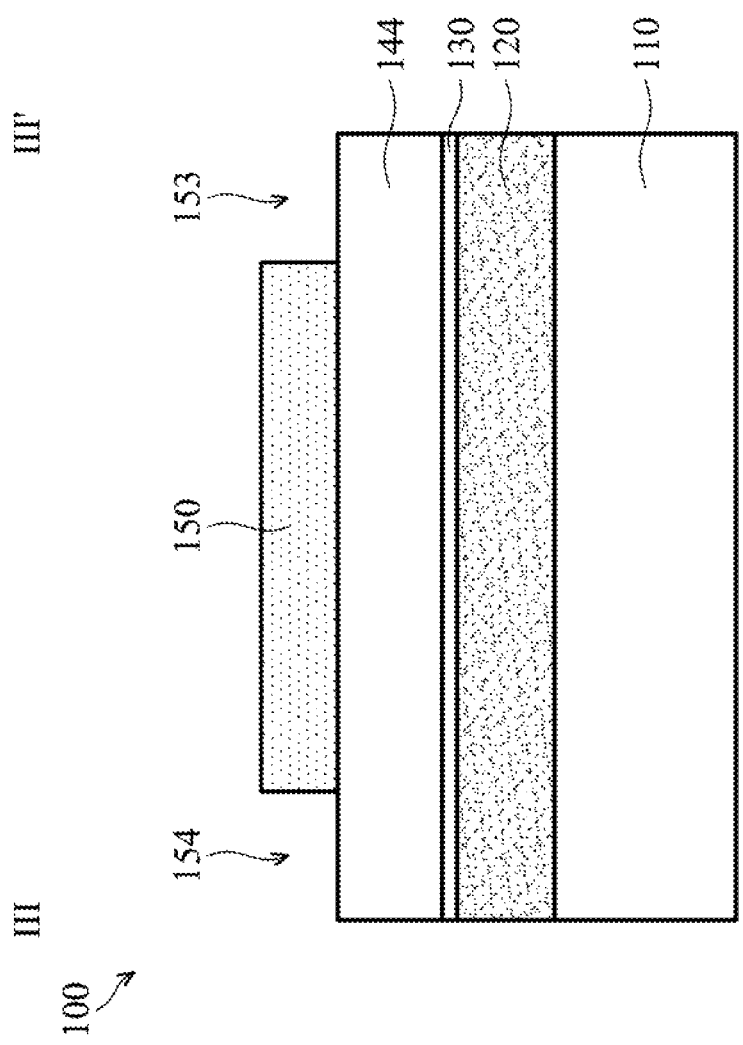
Figure 1D:
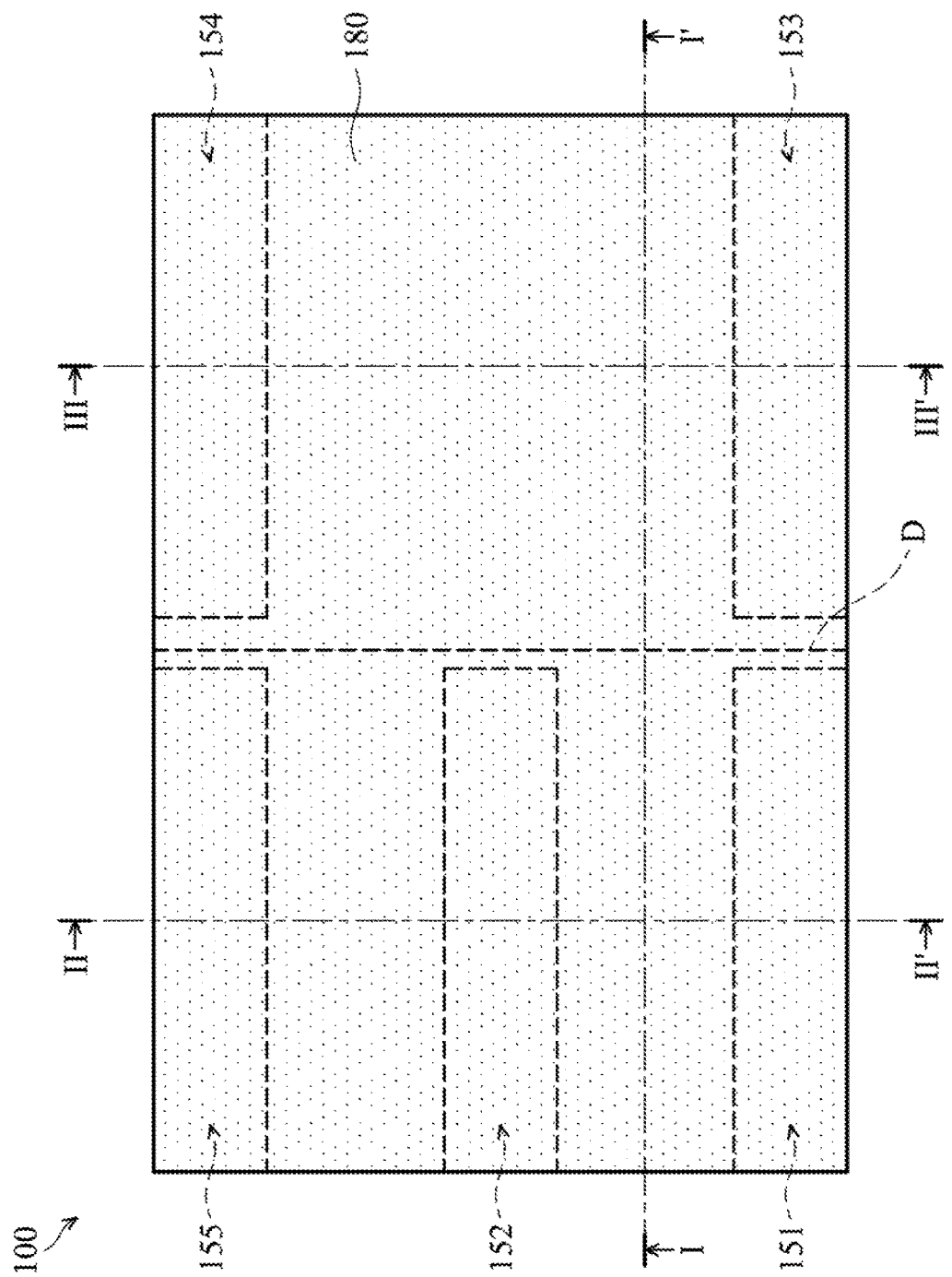
Figures 1, 1D:
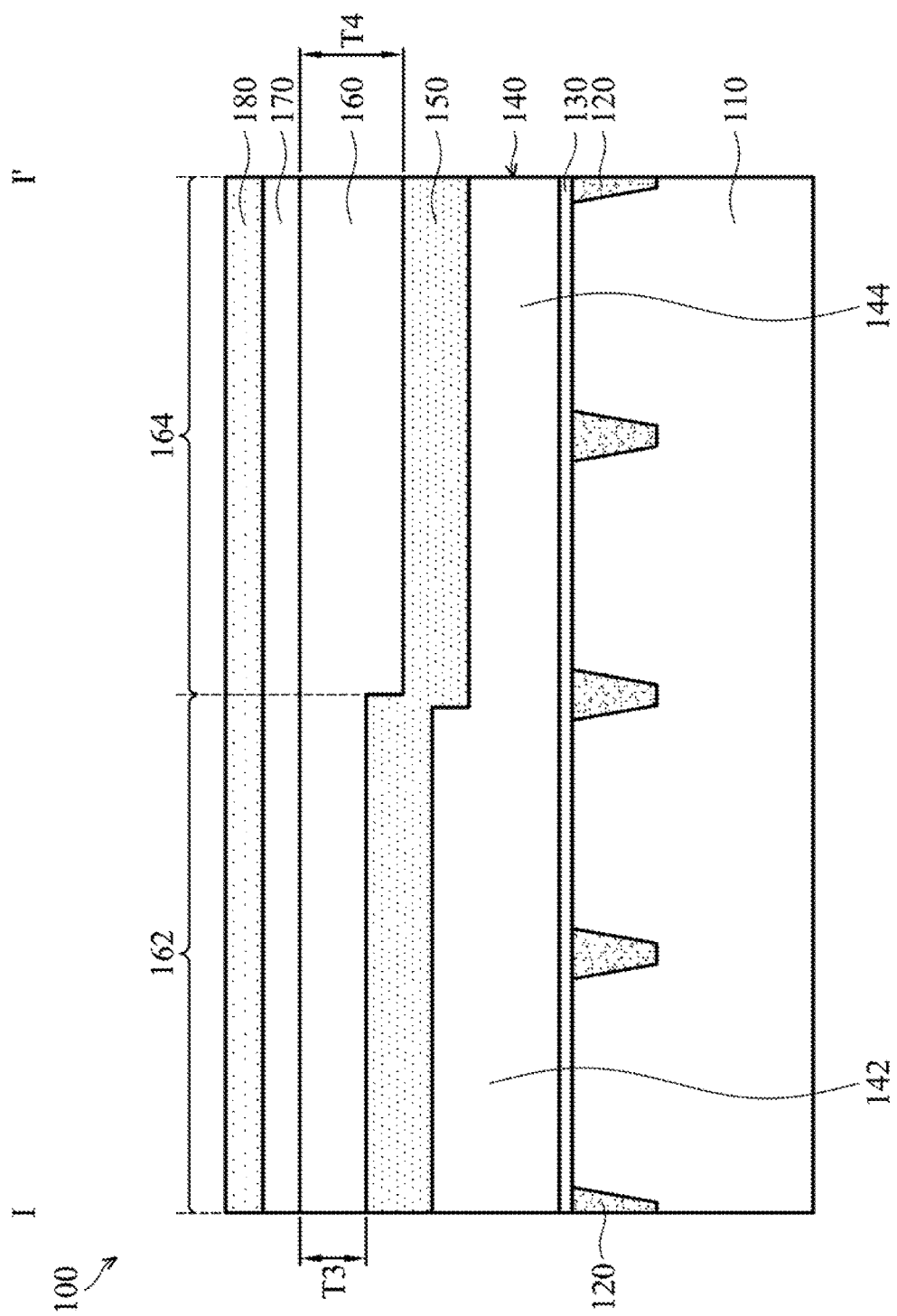
Figures 1, 1D, 2:
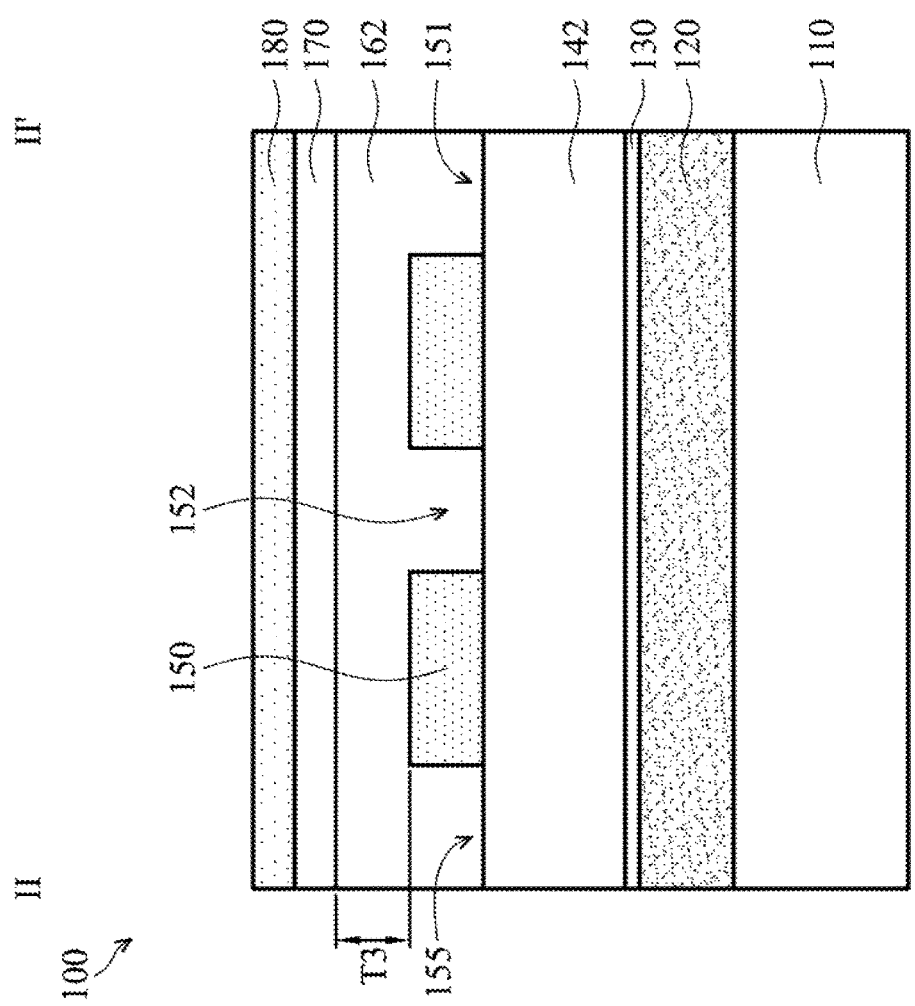
Figures 1, 1D, 2, 3:
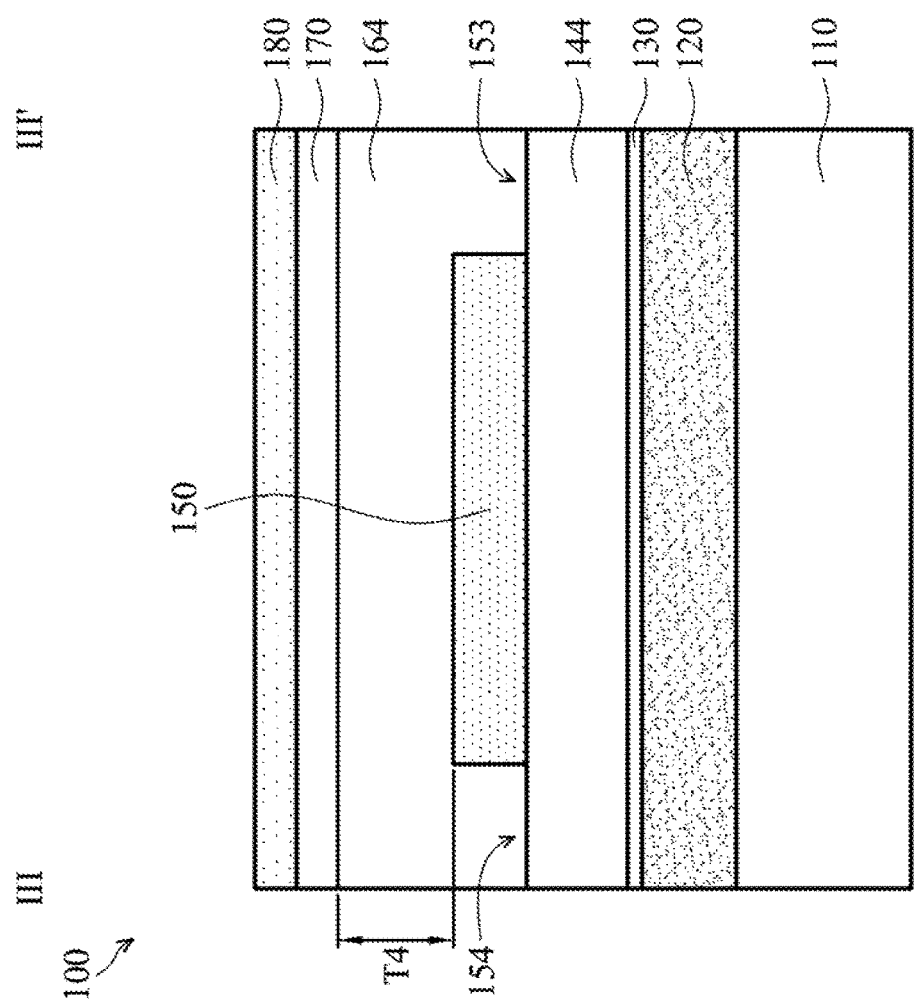
Figure 1E:
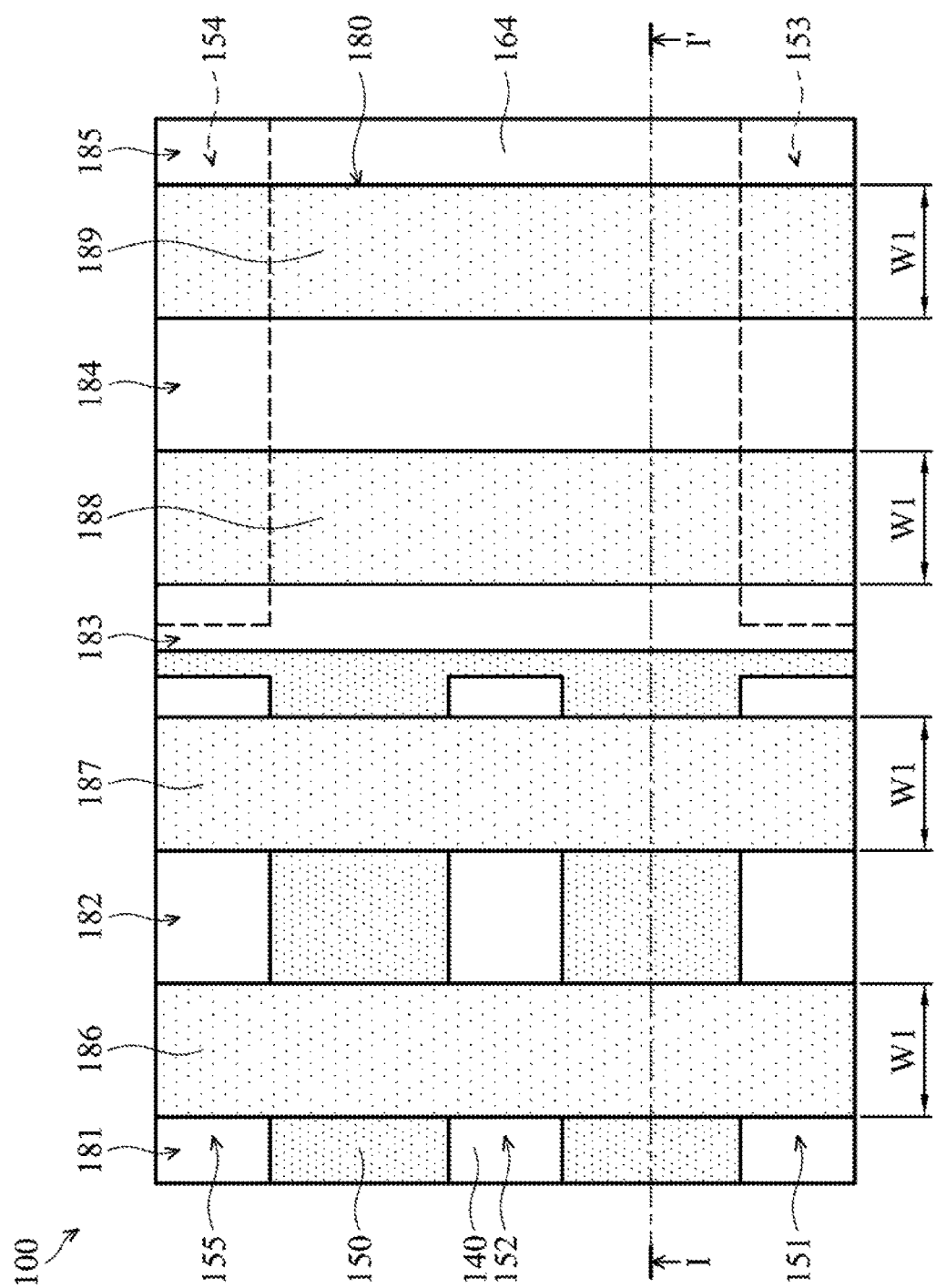
Figures 1, 1E:
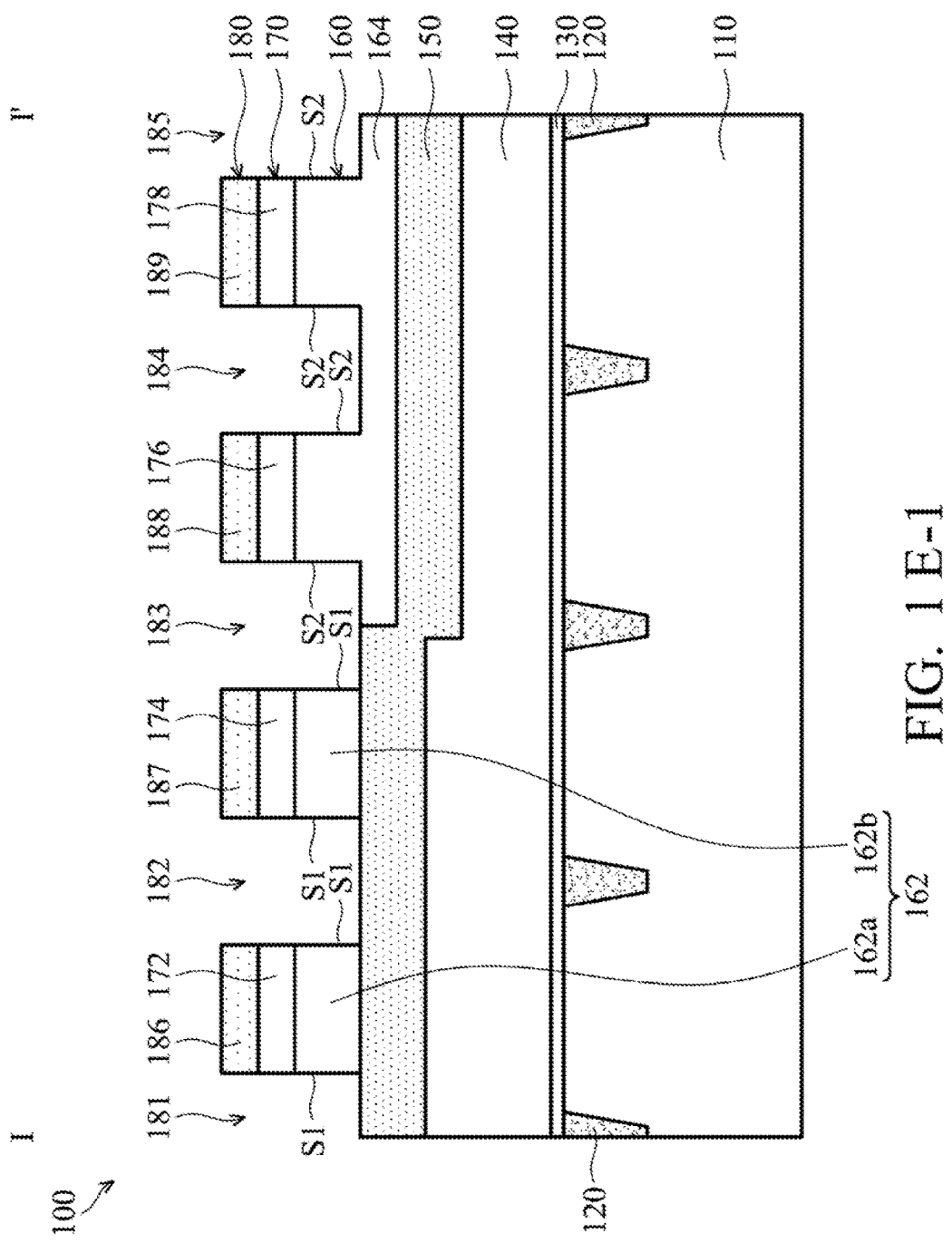
Figure 1F:
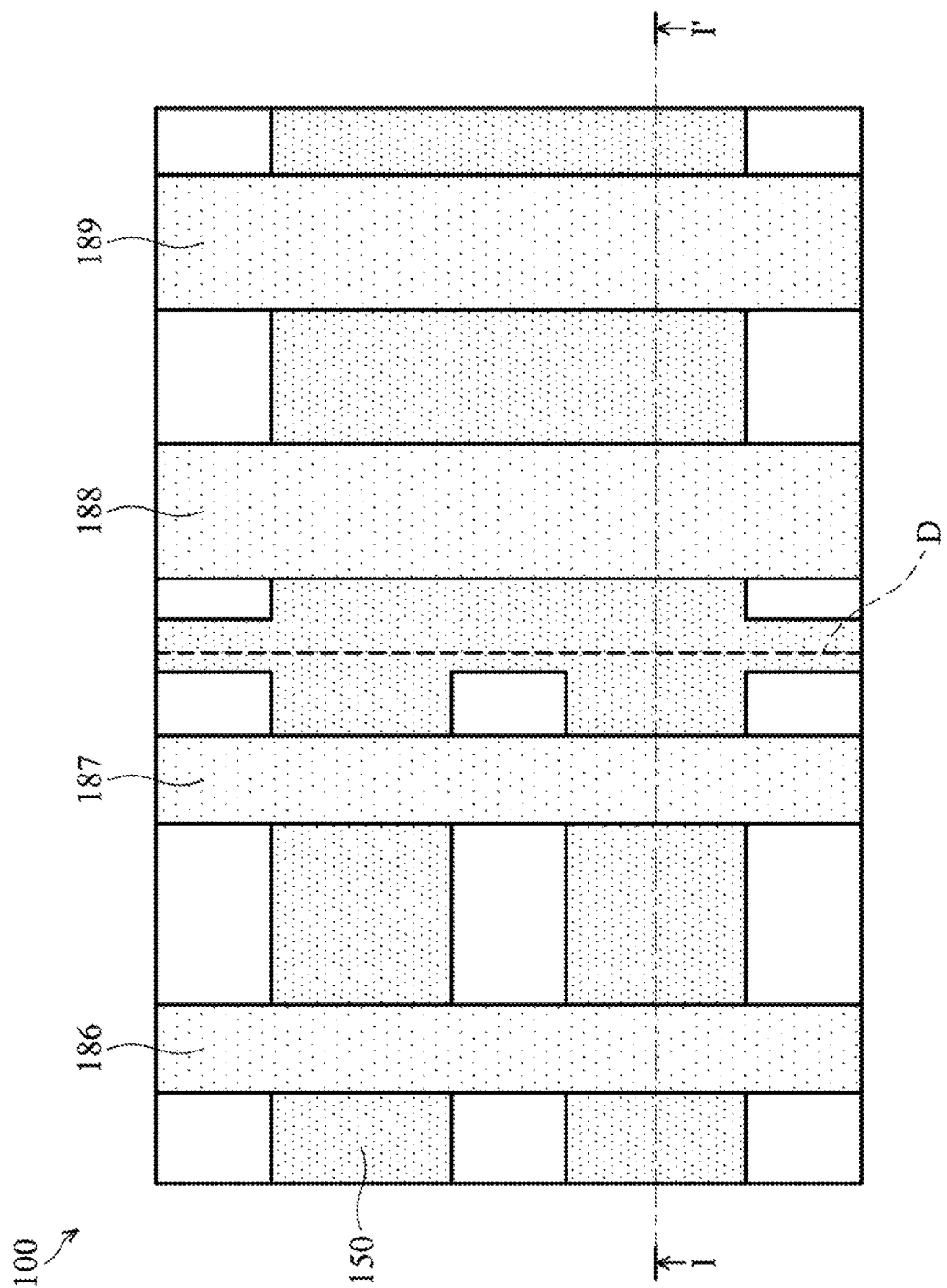
Figures 1, 1F:
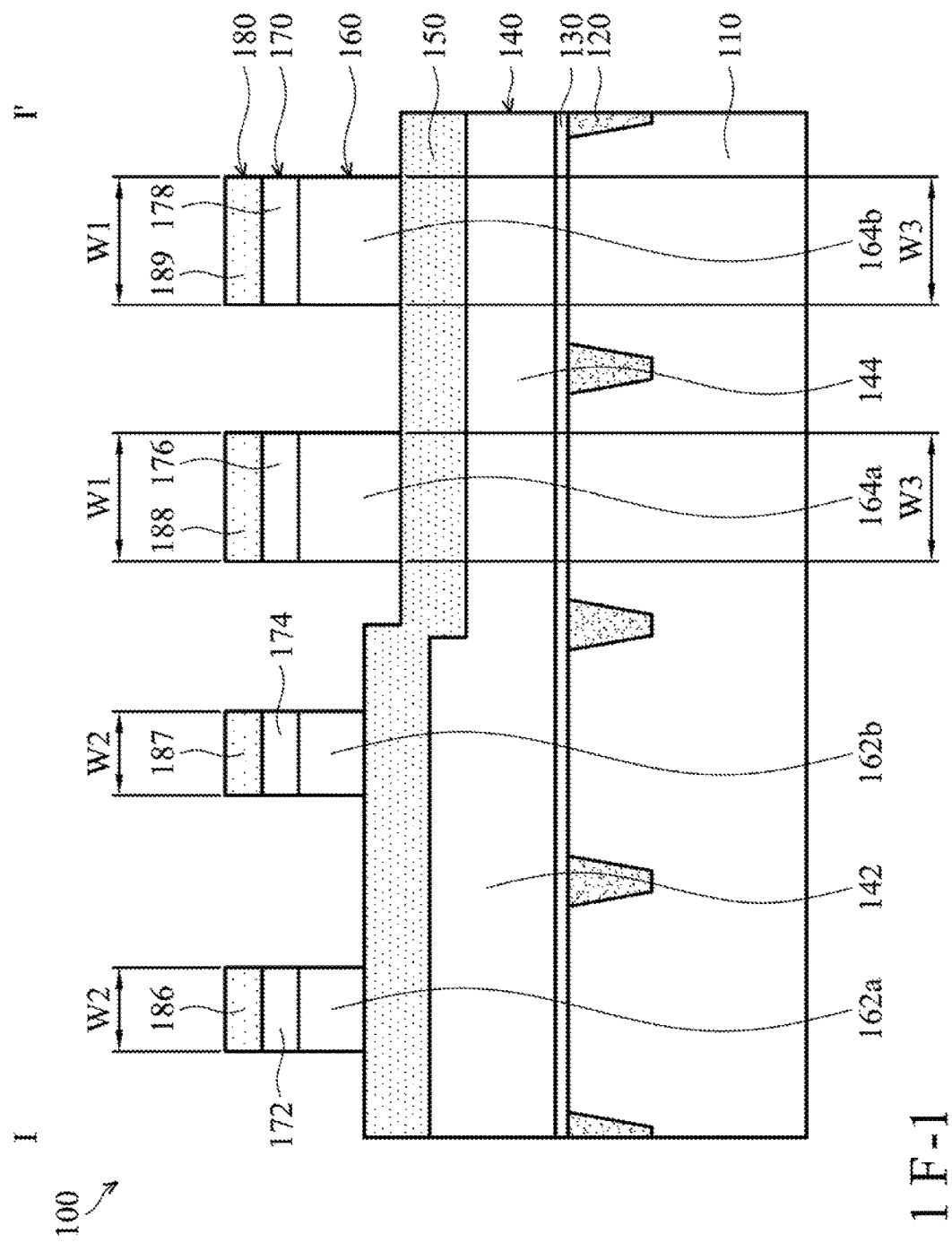
Figure 1G:
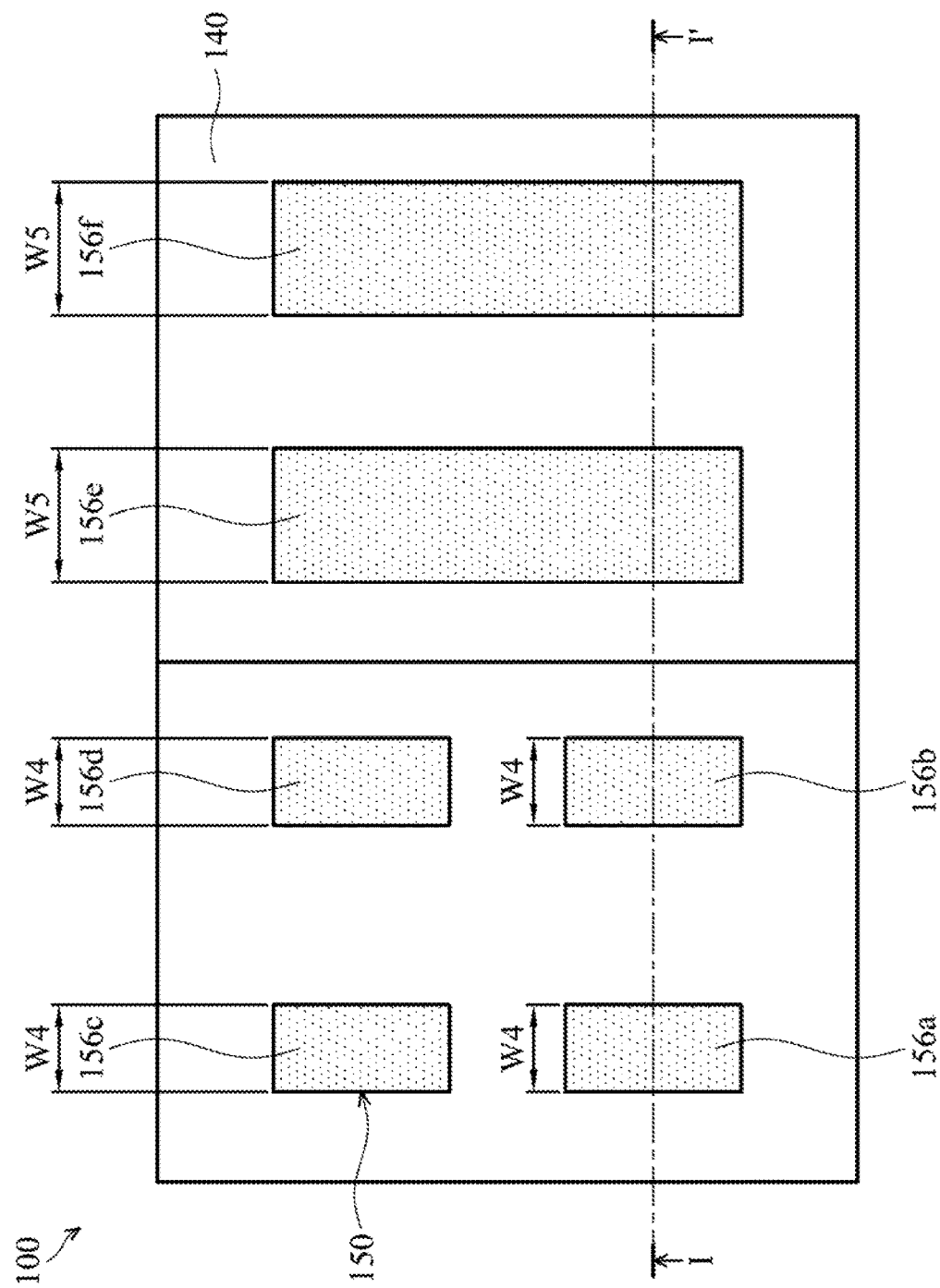
Figures 1, 1G:
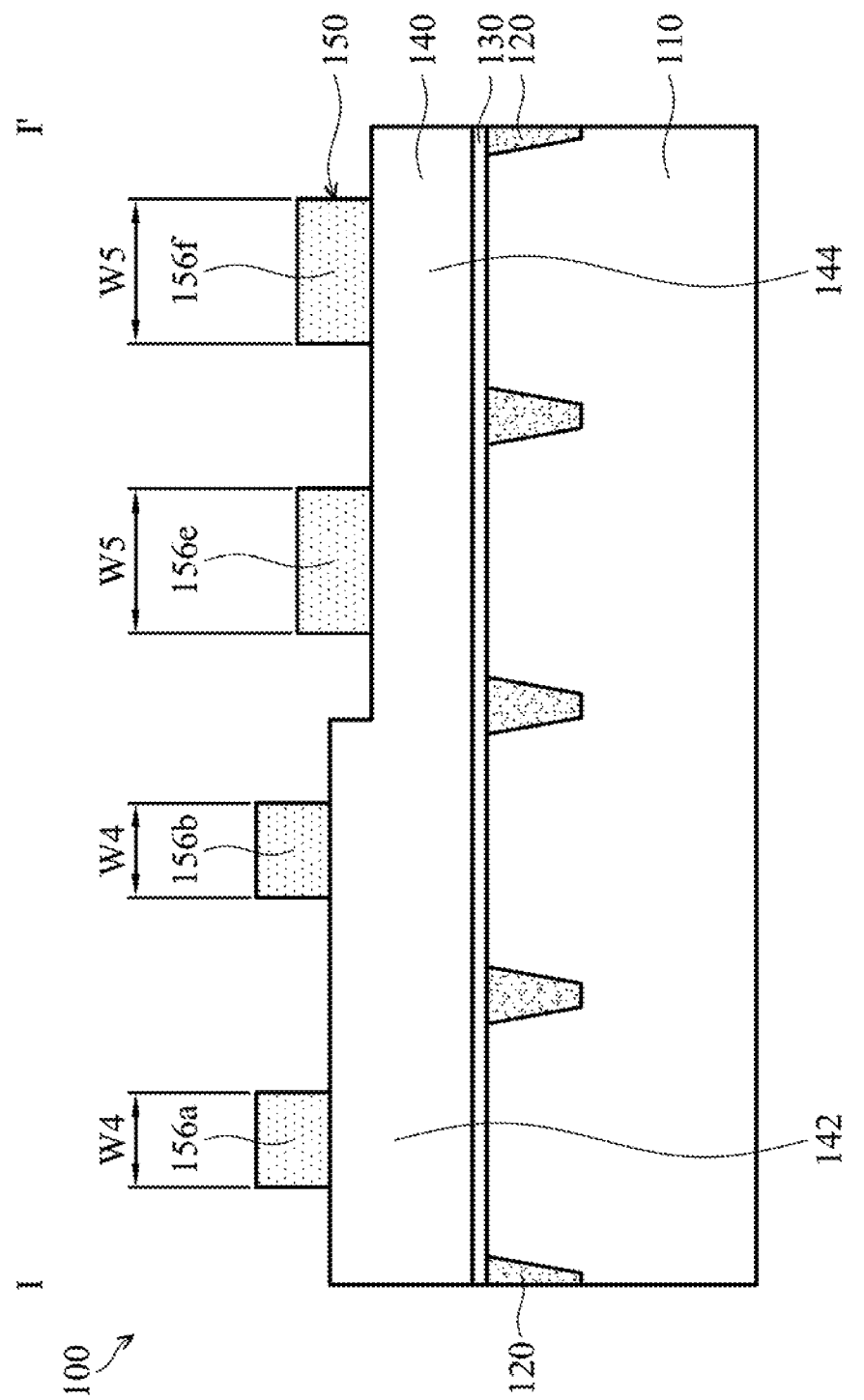
Figure 1H:
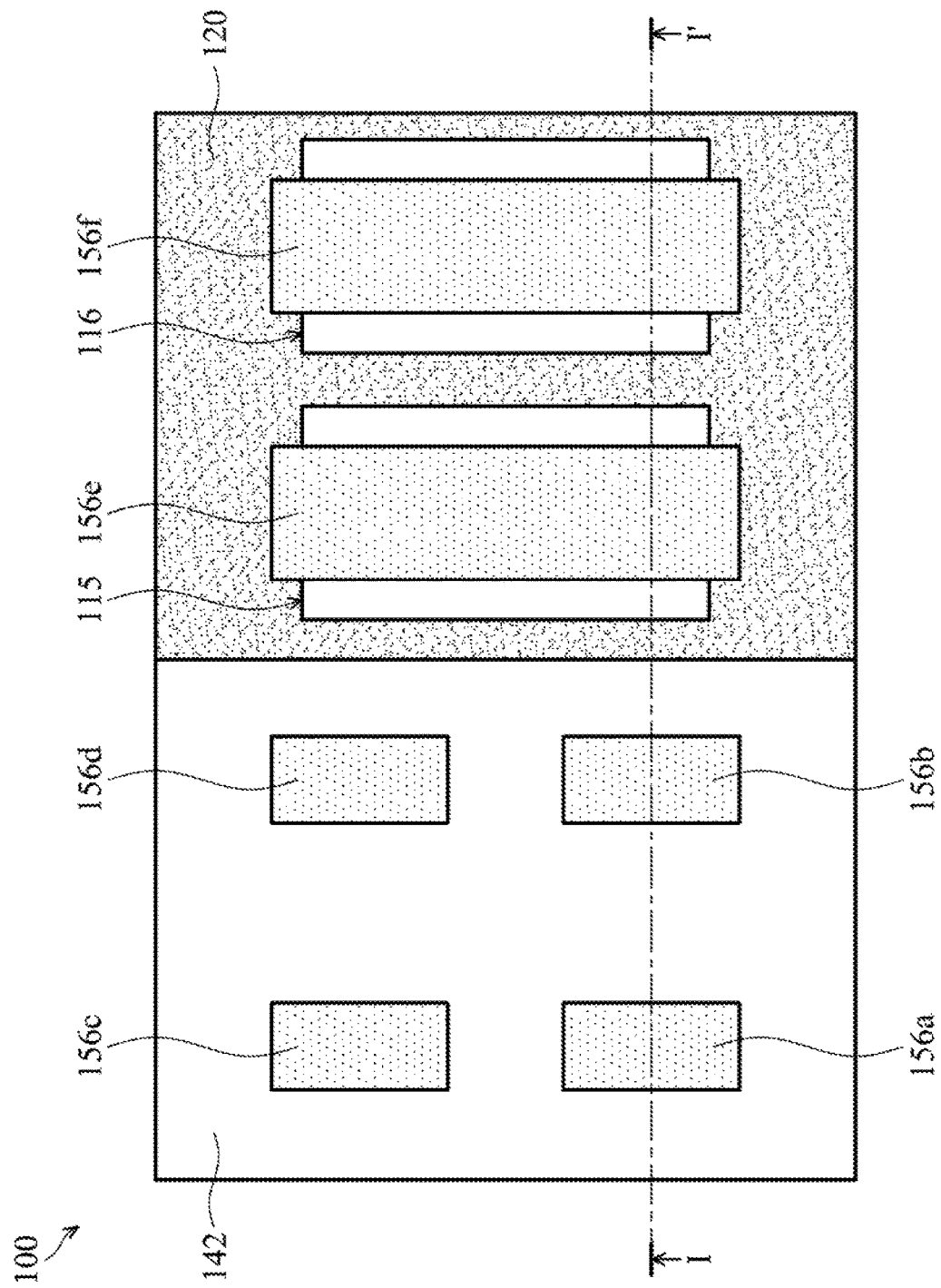
Figures 1, 1H:
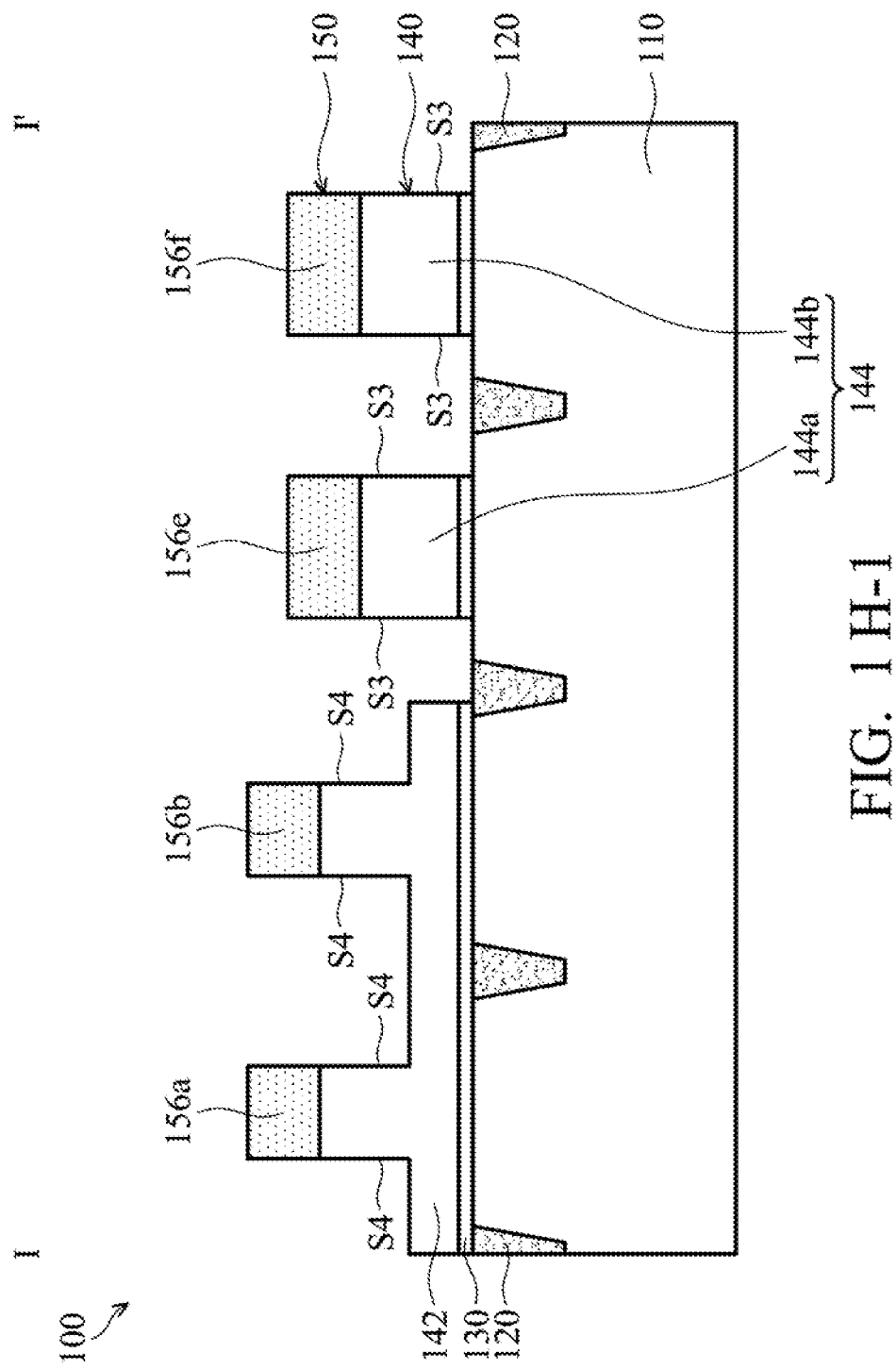
Figure 11:
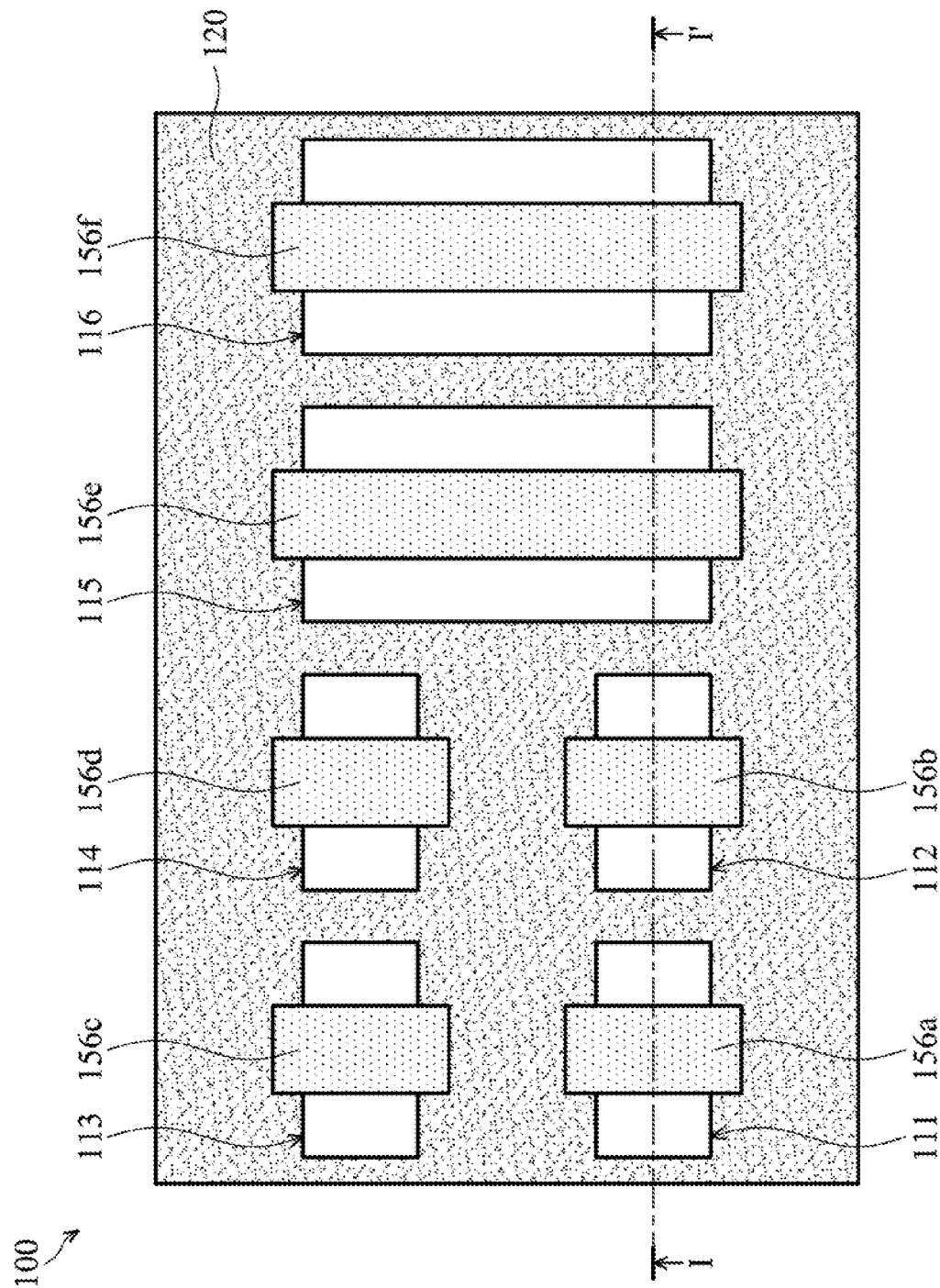
Figures 1, 1I:
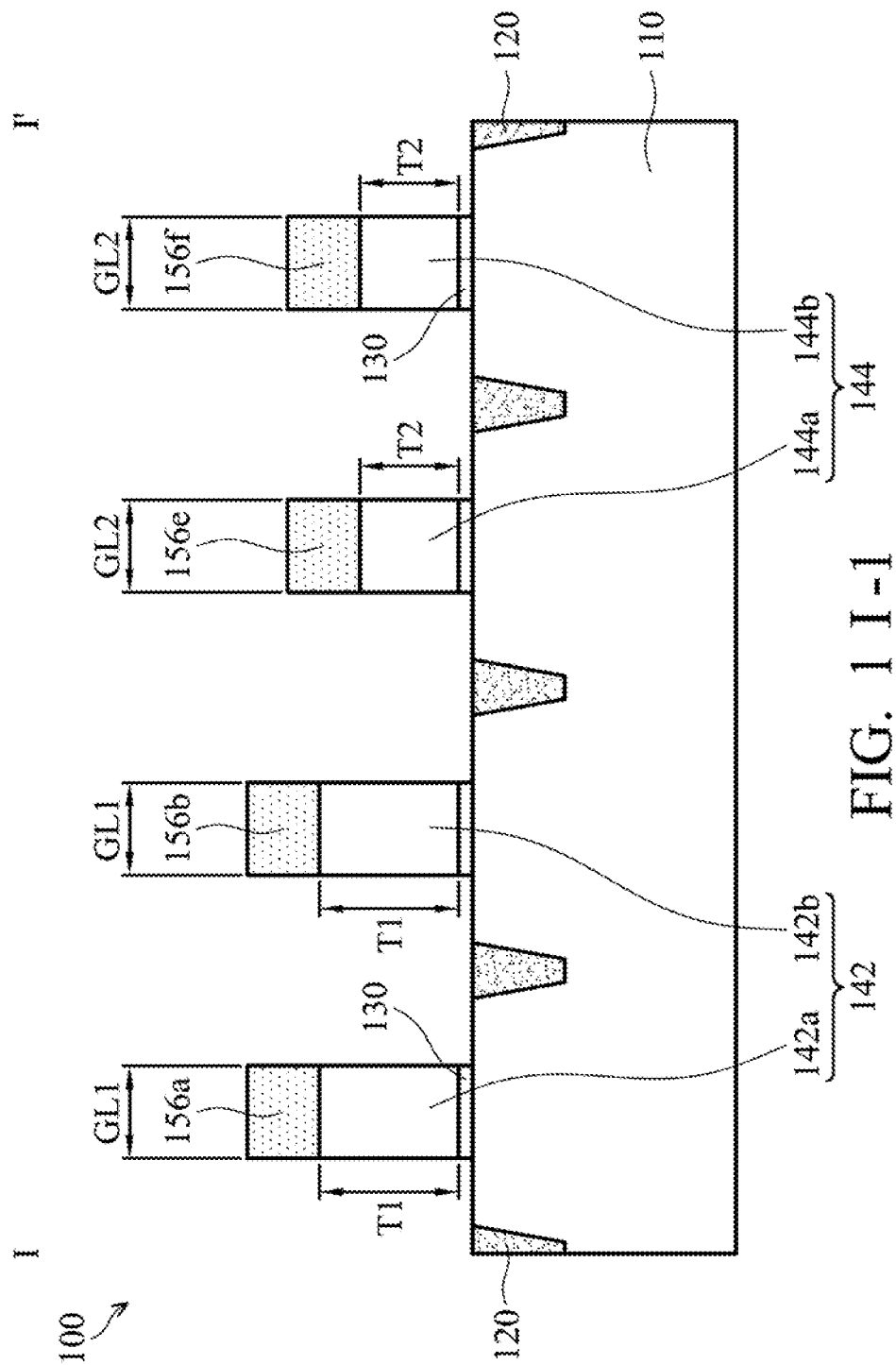
Figure 1J:
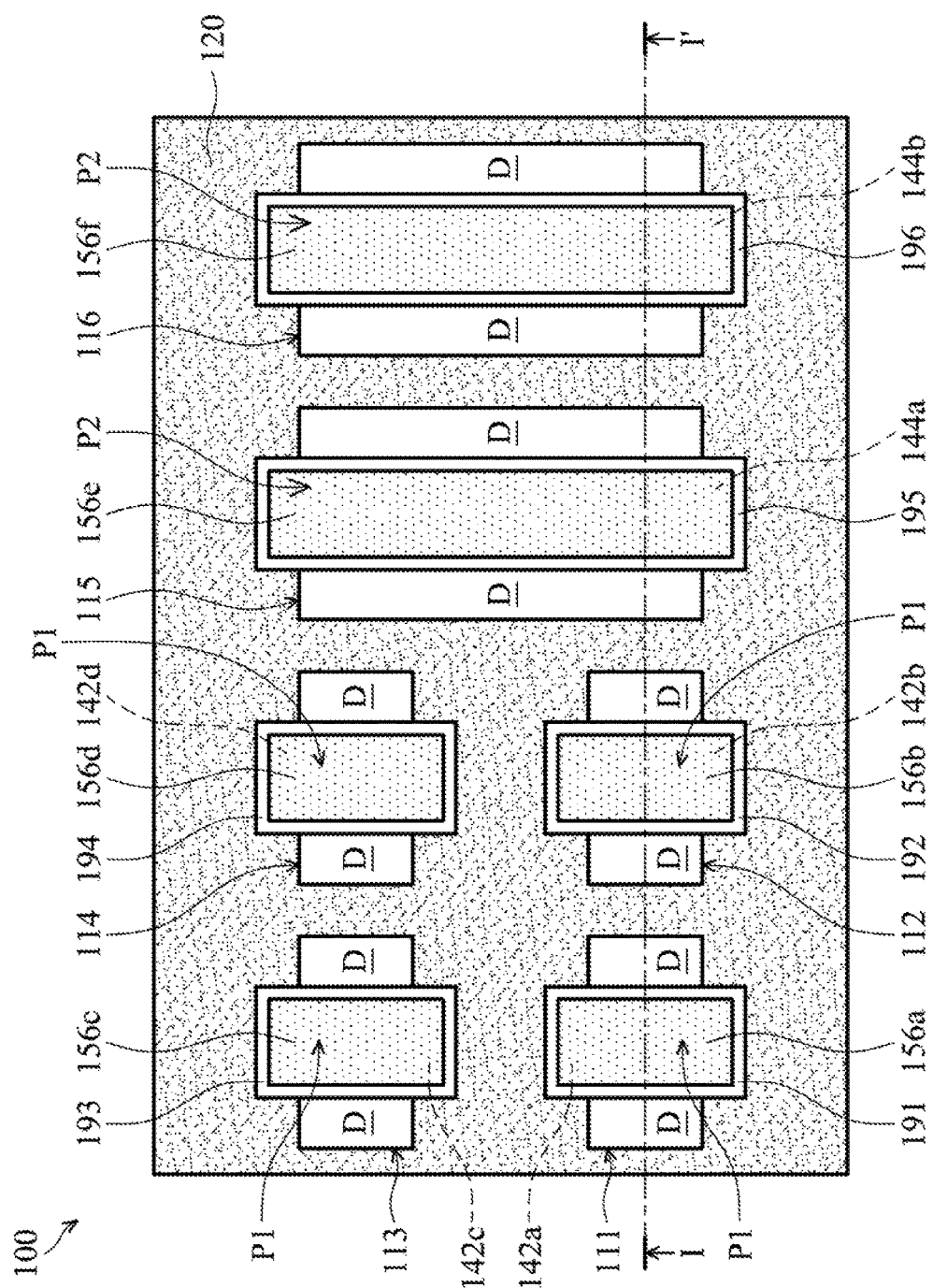
Figures 1, 1J:
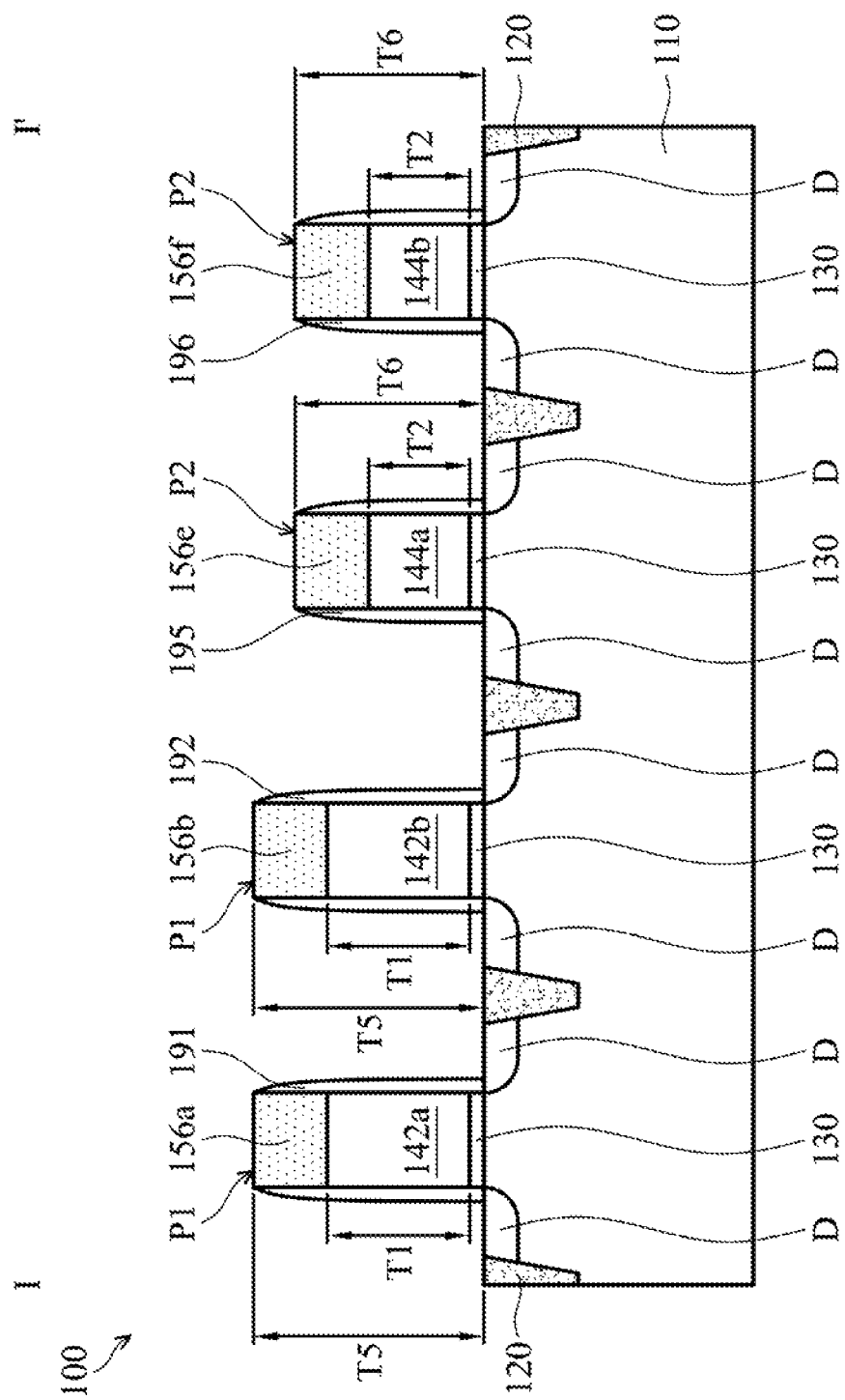

FIGS. 1A-1J are top views of various stages of a process for forming a semiconductor device structure 100, in accordance with some embodiments. FIGS. 1A-1 to 1J-1 are cross-sectional views illustrating a semiconductor device structure 100 along a sectional line I-I' in FIGS. 1A-1J respectively, in accordance with some embodiments. FIGS. 1C-2 to 1D-2 are cross-sectional views illustrating a semiconductor device structure 100 along a sectional line II-II' in FIGS. 1C-1D respectively, in accordance with some embodiments. FIGS. 1C-3 to 1D-3 are cross-sectional views illustrating a semiconductor device structure 100 along a sectional line III-III' in FIGS. 1C-1D respectively, in accordance with some embodiments.

As shown in FIGS. 1A and 1A-1, a substrate 110 is provided, in accordance with some embodiments. The substrate 110 may be a semiconductor wafer such as a silicon wafer. Alternatively or additionally, the substrate 110 may include elementary semiconductor materials, compound semiconductor materials, and/or alloy semiconductor materials.

Examples of the elementary semiconductor materials may be, but are not limited to, crystal silicon, polycrystalline silicon, amorphous silicon, germanium, and/or diamond. Examples of the compound semiconductor materials may be, but are not limited to, silicon carbide, gallium arsenic, gallium phosphide, indium phosphide, indium arsenide, and/or indium antimonide. Examples of the alloy semiconductor materials may be, but are not limited to, SiGe, GaAsP, AlInAs, AlGaAs, GaInAs, GaInP, and/or GaInAsP.

As shown in FIG. 1A, an isolation structure 120 is formed in the semiconductor substrate 110, in accordance with some embodiments. The isolation structure 120 surrounds active regions 111, 112, 113, 114, 115, and 116 of the semiconductor substrate 110, in accordance with some embodiments. The isolation structure 120 is configured to define and electrically isolate various device elements (not shown) formed in the semiconductor substrate 110, in accordance with some embodiments.

Examples of device elements may include, but are not limited to, transistors, diodes, and/or other applicable elements. Examples of the transistors may include, but are not limited to, metal oxide semiconductor field effect transistors (MOSFET), complementary metal oxide semiconductor (CMOS) transistors, bipolar junction transistors (BJT), high voltage transistors, high frequency transistors, p-channel and/or n-channel field effect transistors (PFETs/NFETs), or the like. Various processes are performed to form the device elements, such as deposition, etching, implantation, photolithography, annealing, and/or other applicable processes.

Figure 2A:
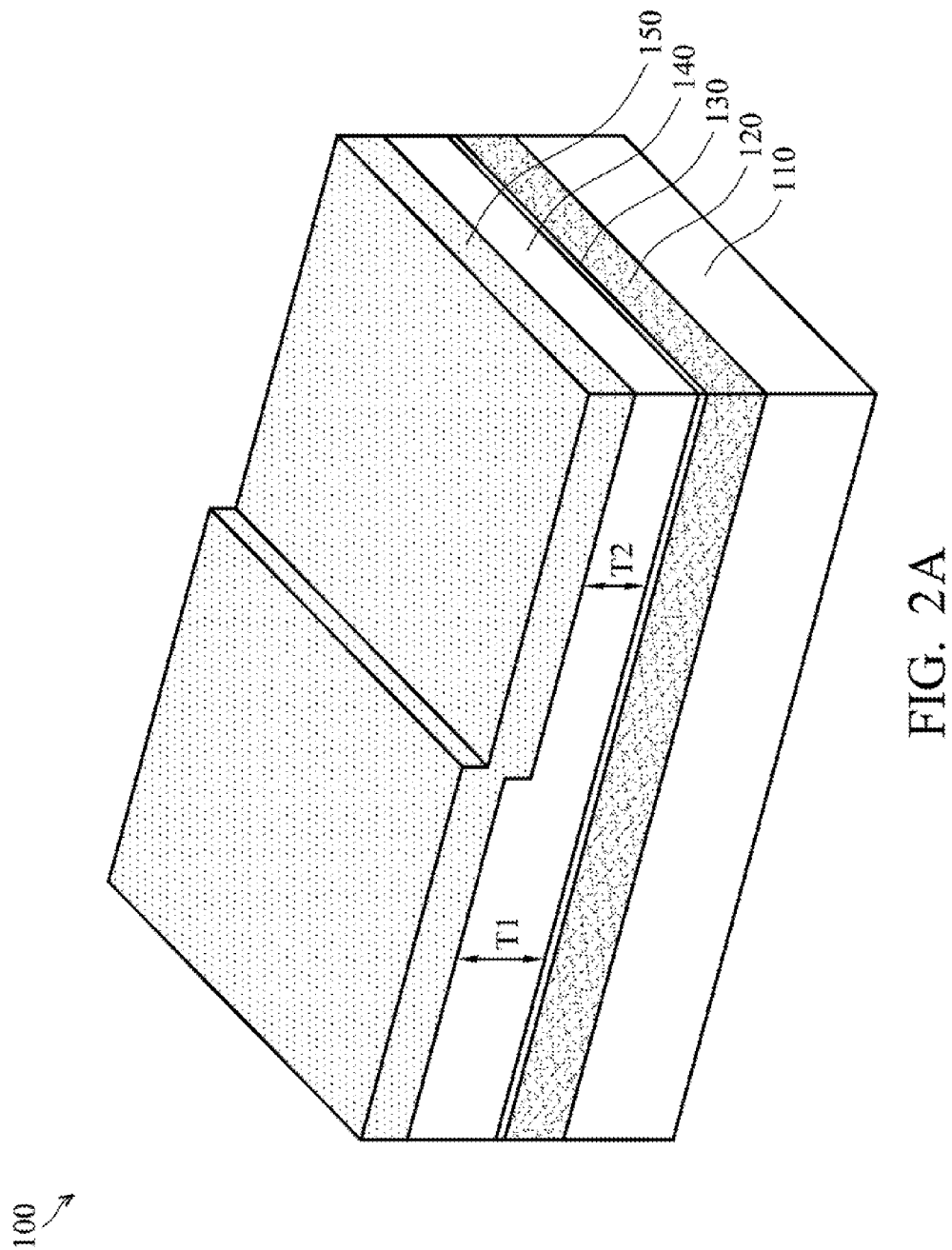
FIG. 2A is a perspective view of the semiconductor device structure of FIG. 1B, in accordance with some embodiments.

FIG. 2A is a perspective view of the semiconductor device structure 100 of FIG. 1B, in accordance with some embodiments. As shown in FIGS. 1B, 1B-1, and 2A, a gate dielectric layer 130 is formed over the semiconductor substrate 110 to cover the active regions 111, 112, 113, 114, 115, and 116 (as shown in FIG. 1A), in accordance with some embodiments. The gate dielectric layer 130 is made of silicon oxide, silicon oxynitride, a combination thereof, or another suitable material.

In some embodiments, the gate dielectric layer 130 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 130 is formed using a chemical vapor deposition process or another suitable process.

As shown in FIGS. 1B, 1B-1, and 2A, a conductive layer 140 is formed over the gate dielectric layer 130, in accordance with some embodiments. The conductive layer 140 has a thick portion 142 and a thin portion 144, in accordance with some embodiments. The thin portion 144 is thinner than the thick portion 142, in accordance with some embodiments.

The thick portion 142 has a thickness T1, in accordance with some embodiments. The thin portion 144 has a thickness T2, in accordance with some embodiments. The thickness T1 is greater than the thickness T2, in accordance with some embodiments. The difference between the thickness T1 and the thickness T2 ranges from about 1 nm to about 3 nm, in accordance with some embodiments.

The conductive layer 140 includes a polysilicon material, a metal material, or another suitable conductive material, in accordance with some embodiments. The conductive layer 140 is formed using a chemical vapor deposition process (or a physical vapor deposition process), a photolithography process, and an etching process, in accordance with some embodiments. The boundary between the thick portion 142 and the thin portion 144 is indicated by the dotted line D in FIG. 1B, in accordance with some embodiments.

As shown in FIGS. 1B, 1B-1, and 2A, a mask layer 150 is formed over the conductive layer 140, in accordance with some embodiments. The mask layer 150 is also referred to as a mask material layer, in accordance with some embodiments. The mask layer 150 includes silicon oxide, silicon nitride (e.g., $Si_3N_4$), SiON, SiC, SiOC, or a combination thereof, in accordance with some embodiments. The mask layer 150 is formed using a chemical vapor deposition (CVD) process, a physical vapor deposition (PVD) process, an atomic layer deposition (ALD) process, a spin-on coating process, or another suitable process. The mask layer 150 conformally covers the conductive layer 140, in accordance with some embodiments.

As shown in FIGS. 1C, 1C-1, 1C-2, and 1C-3, a portion of the mask layer 150 is removed, in accordance with some embodiments. The removal process includes a photolithography process and an etching process, in accordance with some embodiments. After the removal process, trenches 151, 152, 153, 154, and 155 are formed in the mask layer 150, in accordance with some embodiments. The trenches 151, 152, and 155 expose a portion of the thick portion 142, in accordance with some embodiments. The trenches 153 and 154 expose a portion of the thin portion 144, in accordance with some embodiments.

In some embodiments, a distance D1 between the trenches 151 and 152 (or between the trenches 152 and 155) is less than a distance D2 between the trenches 153 and 154. In some embodiments, a trench density of the mask layer 150 over the thick portion 142 is greater than a trench density of the mask layer 150 over the thin portion 144.

The trench density of the mask layer 150 over the thick portion 142 is a ratio of the area of the trenches 151, 152, and 155 to the area of the thick portion 142, in accordance with some embodiments. The trench density of the mask layer 150 over the thin portion 144 is a ratio of the area of the trenches 153 and 154 to the area of the thin portion 144, in accordance with some embodiments.

As shown in FIGS. 1D, 1D-1, 1D-2, and 1D-3, a mask layer 160 is formed over the mask layer 150 and the conductive layer 140, in accordance with some embodiments. In some embodiments, a portion of the mask layer 160 is filled into the trenches 151, 152, 153, 154, and 155. The mask layer 160 includes a polymer material or another suitable material. The mask layer 160 is formed by a coating process, a CVD process, or another suitable process.

The trench density of the mask layer 150 over the thick portion 142 is greater than the trench density of the mask layer 150 over the thin portion 144. Therefore, on the same area of the conductive layer 140, the trenches (i.e., 151, 152, and 155) over the thick portion 142 may accommodate the mask layer 160 more than that accommodated by the trenches (i.e., 153 and 154) over the thin portion 144.

As a result, the mask layer 160 over the thick portion 142 is thinner than the mask layer 160 over the thin portion 144, in accordance with some embodiments. Therefore, the mask layer 160 has a thin portion 162 and a thick portion 164, in accordance with some embodiments. The thin portion 162 is thinner than the thick portion 164, in accordance with some embodiments. The thin portion 162 is over the thick portion 142, in accordance with some embodiments. The thick portion 164 is over the thin portion 144, in accordance with some embodiments.

The thin portion 162 has a thickness T3, in accordance with some embodiments. The thick portion 164 has a thickness T4, in accordance with some embodiments. The thickness T3 is less than the thickness T4, in accordance with some embodiments. In some embodiments, a difference between the thickness T4 and the thickness T3 ranges from about 1 nm to about 3 nm.

As shown in FIGS. 1D, 1D-1, 1D-2, and 1D-3, a middle layer 170 is formed over the mask layer 160, in accordance with some embodiments. In some embodiments, the middle layer 170 is made of a silicon-containing material (e.g., a silicon-containing polymer material). In some embodiments, the mask layers 150 and 160 and the middle layer 170 are made of different materials. The middle layer 170 is formed by a coating process, a CVD process, or another suitable process.

As shown in FIGS. 1D, 1D-1, 1D-2, and 1D-3, a photoresist layer 180 is formed over the middle layer 170, in accordance with some embodiments. The photoresist layer 180 is made of a photoresist material, in accordance with some embodiments. The photoresist layer 180 is formed by, for example, a coating process.

As shown in FIGS. 1E and 1E-1, a portion of the photoresist layer 180 is removed, in accordance with some embodiments. The removal process includes a photolithography process, in accordance with some embodiments. After the removal process, trenches 181, 182, 183, 184, and 185 are formed in the photoresist layer 180 and isolated from each other, in accordance with some embodiments.

The photoresist layer 180 has strip portions 186, 187, 188, and 189 isolated from each other by the trenches 182, 183, and 184, in accordance with some embodiments. The strip portions 186, 187, 188, and 189 have the same width W1, in accordance with some embodiments. The strip portions 186 and 187 both overlap the mask layer 150 between the trenches 151, 152, and 155, in accordance with some embodiments. The strip portions 188 and 189 both overlap the mask layer 150 between the trenches 153 and 154, in accordance with some embodiments.

As shown in FIGS. 1E and 1E-1, the mask layer 160 and the middle layer 170 exposed by the trenches 181, 182, 183, 184, and 185 are removed, in accordance with some embodiments. The removal process includes an etching process, in accordance with some embodiments. The etching process includes an anisotropic etching process, such as a dry etching process, in accordance with some embodiments.

As shown in FIGS. 1E and 1E-1, during the removal process, when the thin portion 162 is etched through, the thick portion 164 is not yet etched through. The thin portion 162 has strip portions 162a and 162b under the strip portions 186 and 187, respectively, in accordance with some embodiments. The middle layer 170 has strip portions 172, 174, 176, and 178 under the strip portions 186, 187, 188, and 189, respectively, in accordance with some embodiments.

Since the thin portion 162 is etched through and the thick portion 164 is not yet etched through, the etchants etch the sidewalls S1 of the strip portions 162a and 162b at a higher rate than the sidewalls S2 of the thick portion 164, in accordance with some embodiments. Similarly, the etchants etch the sidewalls of the strip portions 172, 174, 186, and 187 at a higher rate than the sidewalls of the strip portions 176, 178, 188, and 189, in accordance with some embodiments.

Therefore, as shown in FIGS. 1F and 1F-1, after the removal process, the strip portions 162a, 162b, 172, 174, 186, and 187 are narrowed, and the thick portion 164 is etched through, in accordance with some embodiments. The thick portion 164 has strip portions 164a and 164b, in accordance with some embodiments. The strip portion 162a or 162b is thinner than and narrower than the strip portion 164a or 164b, in accordance with some embodiments.

The strip portion 162a or 162b has a width W2, in accordance with some embodiments. The strip portion 164a or 164b has a width W3, in accordance with some embodiments. The width W2 is less than the width W3 or W1, in accordance with some embodiments. The width W3 is substantially equal to or close to the width W1, in accordance with some embodiments.

As shown in FIGS. 1F, 1F-1, 1G, and 1G-1, portions of the mask layer 150 exposed by the mask layers 160 and 170 and the photoresist layer 180 are removed, in accordance with some embodiments. The removal process includes performing an etching process using the mask layers 160 and 170 and the photoresist layer 180 as etching masks, in accordance with some embodiments. The etching process includes an anisotropic etching process, such as a dry etching process, in accordance with some embodiments. After the etching process, the mask layer 150 has strip portions 156a, 156b, 156c, 156d, 156e, and 156f isolated from each other, in accordance with some embodiments.

The strip portion 156e or 156f is wider than the strip portion 156a, 156b, 156c, or 156d, in accordance with some embodiments. The strip portion 156a, 156b, 156c, or 156d has the width W4, in accordance with some embodiments. The strip portion 156e or 156f has the width W5, in accordance with some embodiments. The width W4 is less than the width W5, in accordance with some embodiments.

As shown in FIGS. 1H and 1H-1, the conductive layer 140 exposed by the mask layer 150 is removed, in accordance with some embodiments. The removal process includes an etching process, in accordance with some embodiments. The etching process includes an anisotropic etching process, in accordance with some embodiments. The anisotropic etching process includes a dry etching process, in accordance with some embodiments.

As shown in FIGS. 1H and 1H-1, during the etching process, when the thin portion 144 is etched through, the thick portion 142 is not yet etched through. The thin portion 144 has gate structures 144a and 144b under the strip portions 156e and 156f, respectively, in accordance with some embodiments.

Since the thin portion 144 is etched through and the thick portion 142 is not yet etched through, the etchants etch the sidewalls S3 of the gate structures 144a and 144b at a higher rate than the sidewalls S4 of the thick portion 142, in accordance with some embodiments. Similarly, the etchants etch the sidewalls of the strip portions 156e and 156f at a higher rate than the sidewalls of the strip portions 156a, 156b, 156c, and 156d, in accordance with some embodiments.

Figure 2B:
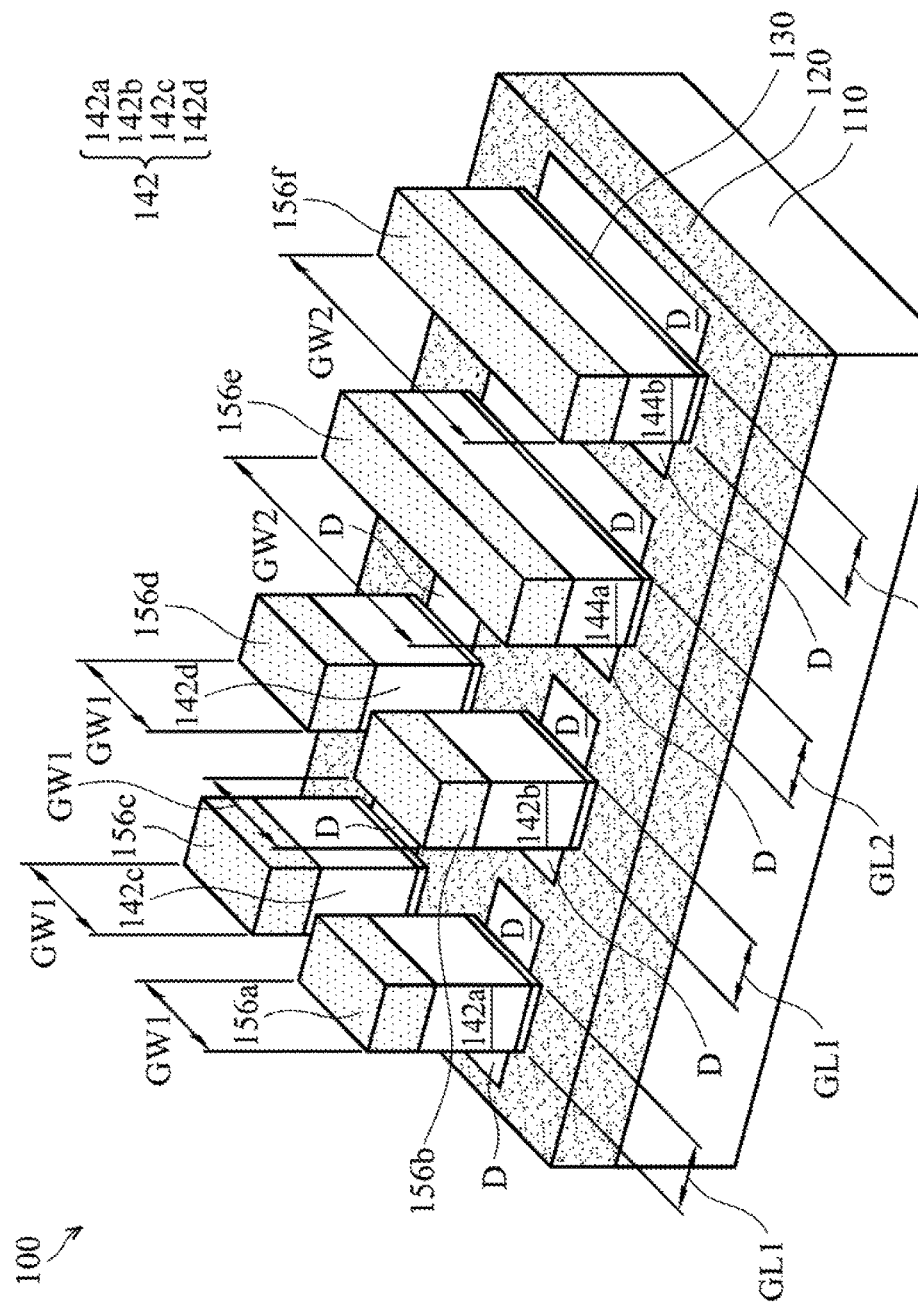
FIG. 2B is a perspective view of a semiconductor device structure of FIG. 1I, in accordance with some embodiments.

FIG. 2B is a perspective view of a semiconductor device structure 100 of FIG. 1I, in accordance with some embodiments. As shown in FIGS. 1I, 1I-1, and 2B, after the etching process, the gate structures 144a and 144b and the strip portions 156e and 156f are narrowed, and the thick portion 142 is etched through, in accordance with some embodiments. The thick portion 142 has gate structures 142a, 142b, 142c, and 142d, in accordance with some embodiments. Each of the gate structure 142a, 142b, 142c, or 142d has a gate length GL1 and a gate width GW1, in accordance with some embodiments.

Each of the gate structure 144a or 144b has a gate length GL2 and a gate width GW2, in accordance with some embodiments. The gate length GL1 is substantially equal to or close to the gate length GL2, in accordance with some embodiments. In some embodiments, a ratio of the difference between the gate lengths GL1 and GL2 to the gate length GL1 or GL2 ranges from about 0.1% to 2.5%. The gate width GW1 is less than the gate width GW2, in accordance with some embodiments.

Since the thick portion 142 and the thin portion 144 have the thicknesses T1 and T2 respectively, each of the gate structure 142a, 142b, 142c, or 142d has the thickness T1, and each of the gate structure 144a or 144b has the thickness T2, in accordance with some embodiments. The thickness T1 is greater than the thickness T2, in accordance with some embodiments.

The difference between the thickness T1 and the thickness T2 ranges from about 1 nm to about 3 nm, in accordance with some embodiments. The ratio of the difference between the thickness T1 and the thickness T2 to the thickness T1 or T2 ranges from about 1% to about 3%, in accordance with some embodiments.

The gate width GW1 is less than the gate width GW2, in accordance with some embodiments. The gate width GW1 is substantially equal to or closes to the distance D1, as shown in FIG. 1C, in accordance with some embodiments. The gate width GW2 is substantially equal to or closes to the distance D2, as shown in FIG. 1C, in accordance with some embodiments.

Figure 2C:
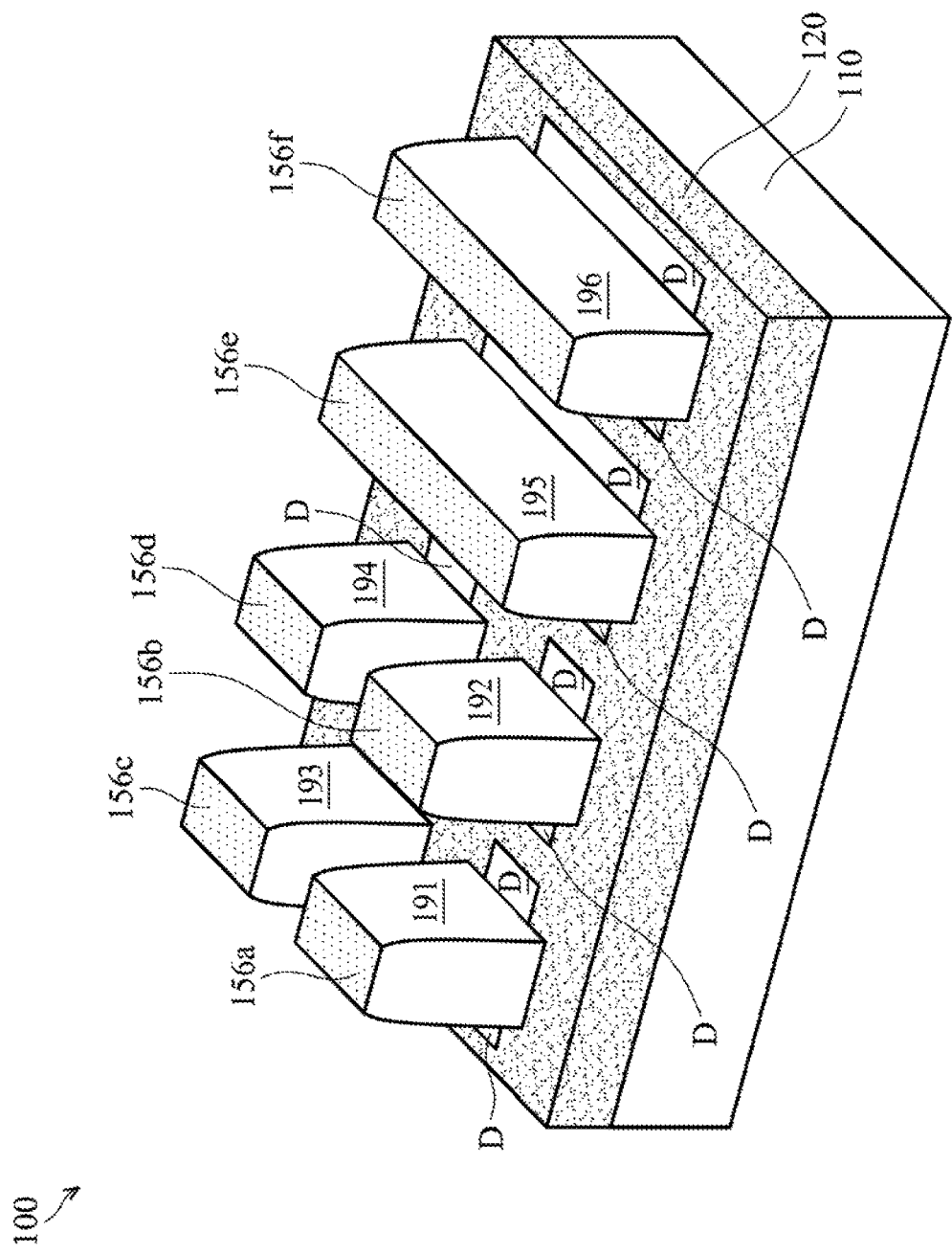
FIG. 2C is a perspective view of a semiconductor device structure of FIG. 1J, in accordance with some embodiments.

FIG. 2C is a perspective view of a semiconductor device structure of FIG. 1J, in accordance with some embodiments. As shown in FIGS. 1J, 1J-1, and 2C, spacers 191, 192, 193, 194, 195, and 196 are formed, in accordance with some embodiments. The spacers 191, 192, 193, 194, 195, and 196 surround the gate structures 142a, 142b, 142c, 142d, 144a, and 144b, respectively, in accordance with some embodiments.

The spacers 191, 192, 193, 194, 195, and 196 further surround the strip portions 156a, 156b, 156c, 156d, 156e, and 156f, respectively, in accordance with some embodiments. The spacers 191, 192, 193, 194, 195, and 196 include a dielectric material, such as silicon nitride, silicon oxynitride, or a combination thereof, in accordance with some embodiments.

As shown in FIGS. 1J and 1J-1, the top surface P1 of each of the strip portion 156a, 156b, 156c, or 156d is not aligned with the top surface P2 of each of the strip portion 156e or 156f, in accordance with some embodiments. As shown in FIGS. 1J and 1J-1, the thickness T5 of each of the spacer 191, 192, 193, or 194 is greater than the thickness T6 of each of the spacer 195 or 196, in accordance with some embodiments.

As shown in FIGS. 1J and 1J-1, doped regions D are formed in the active regions 111, 112, 113, 114, 115, and 116, in accordance with some embodiments. The doped regions D are formed at opposite sides of the gate structures 142a, 142b, 142c, 142d, 144a, and 144b, respectively, in accordance with some embodiments. That is, each of the gate structure 142a, 142b, 142c, 142d, 144a, or 144b is formed between the corresponding two doped regions D, in accordance with some embodiments.

The doped regions D are formed using an ion implantation process, in accordance with some embodiments. The doped regions D include heavily doped source regions and heavily doped drain regions, in accordance with some embodiments. The doped regions D are formed after the formation of the spacers 191, 192, 193, 194, 195, and 196, in accordance with some embodiments.

Since the conductive layer 140 has the thick portion 142 and the thin portion 144 (as shown in FIG. 1G-1), even if the width W4 of the strip portion 156a, 156b, 156c, or 156d is less than the width W5 of the strip portion 156e or 156f, the gate length GL1 is substantially equal to or close to the gate length GL2 (as shown in FIG. 1I-1). That is, the thickness difference between the thick portion 142 and the thin portion 144 is able to compensate the width difference between the strip portions 156a, 156b, 156c, and 156d and the strip portions 156e and 156f so as to form the gate structures 142a, 142b, 142c, 142d, 144a, and 144b with the same or similar gate lengths.

Therefore, critical dimension uniformity (or gate length uniformity) of the gate structures 142a, 142b, 142c, 142d, 144a, and 144b is improved, in accordance with some embodiments. As a result, the uniformity of the drain saturation current (Idsat) is improved as well, in accordance with some embodiments. Therefore, the electrical properties and the yield of the semiconductor device structure 100 are improved, in accordance with some embodiments.

Figure 3A:
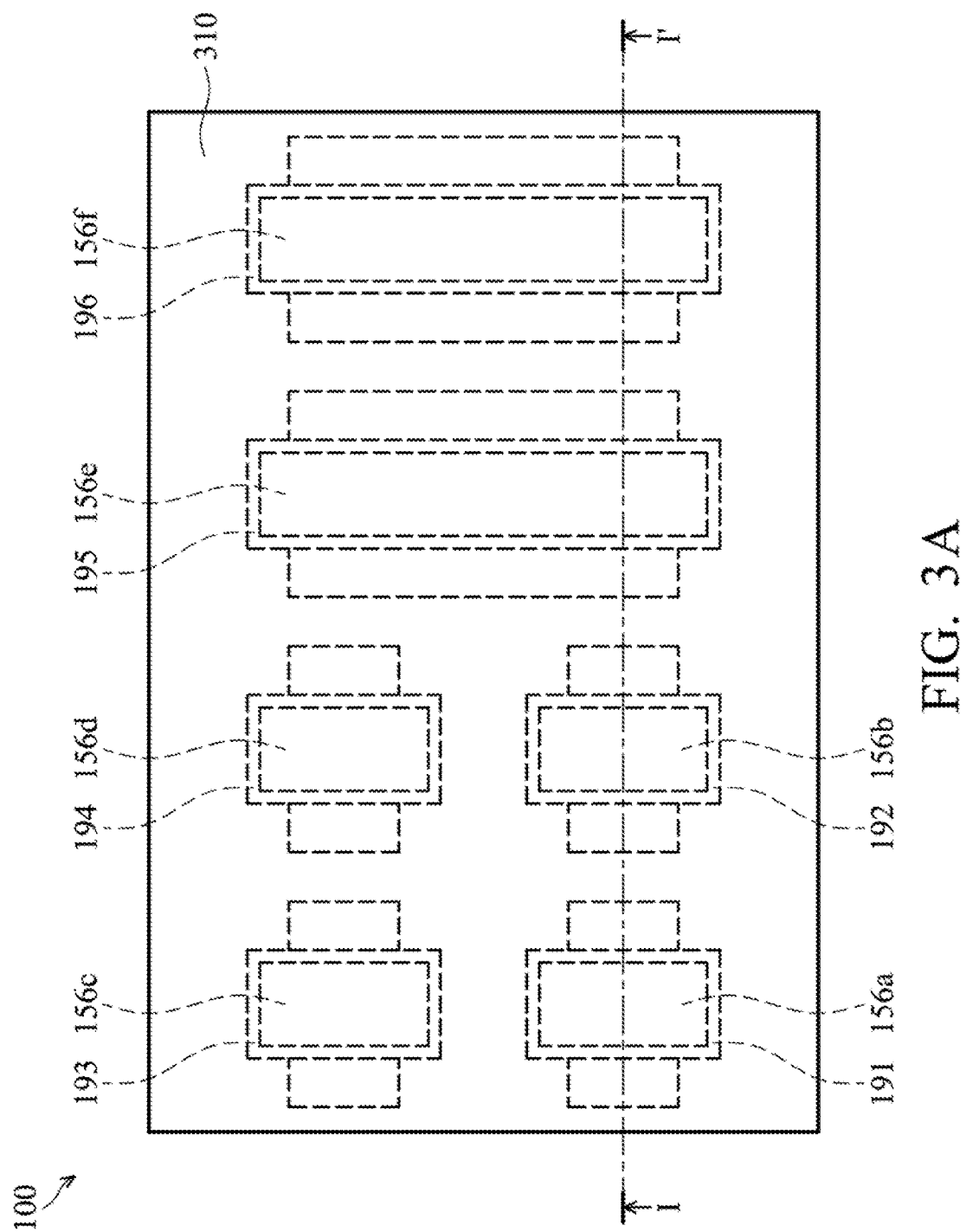
FIGS. 3A-3H are top views of various stages of a process for forming a semiconductor device structure, in accordance with some embodiments.
Figures 1, 3A:
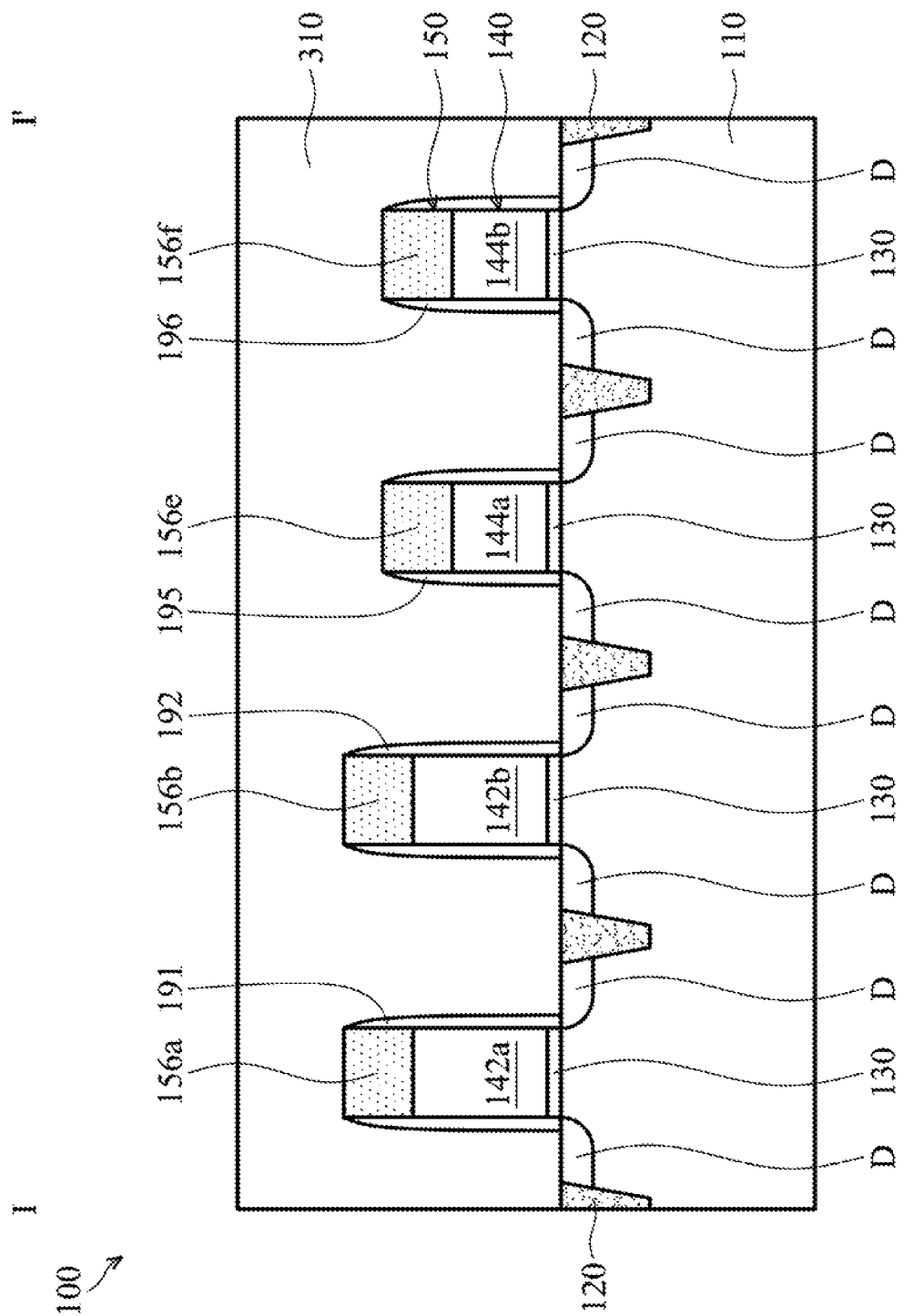
Figure 3B:
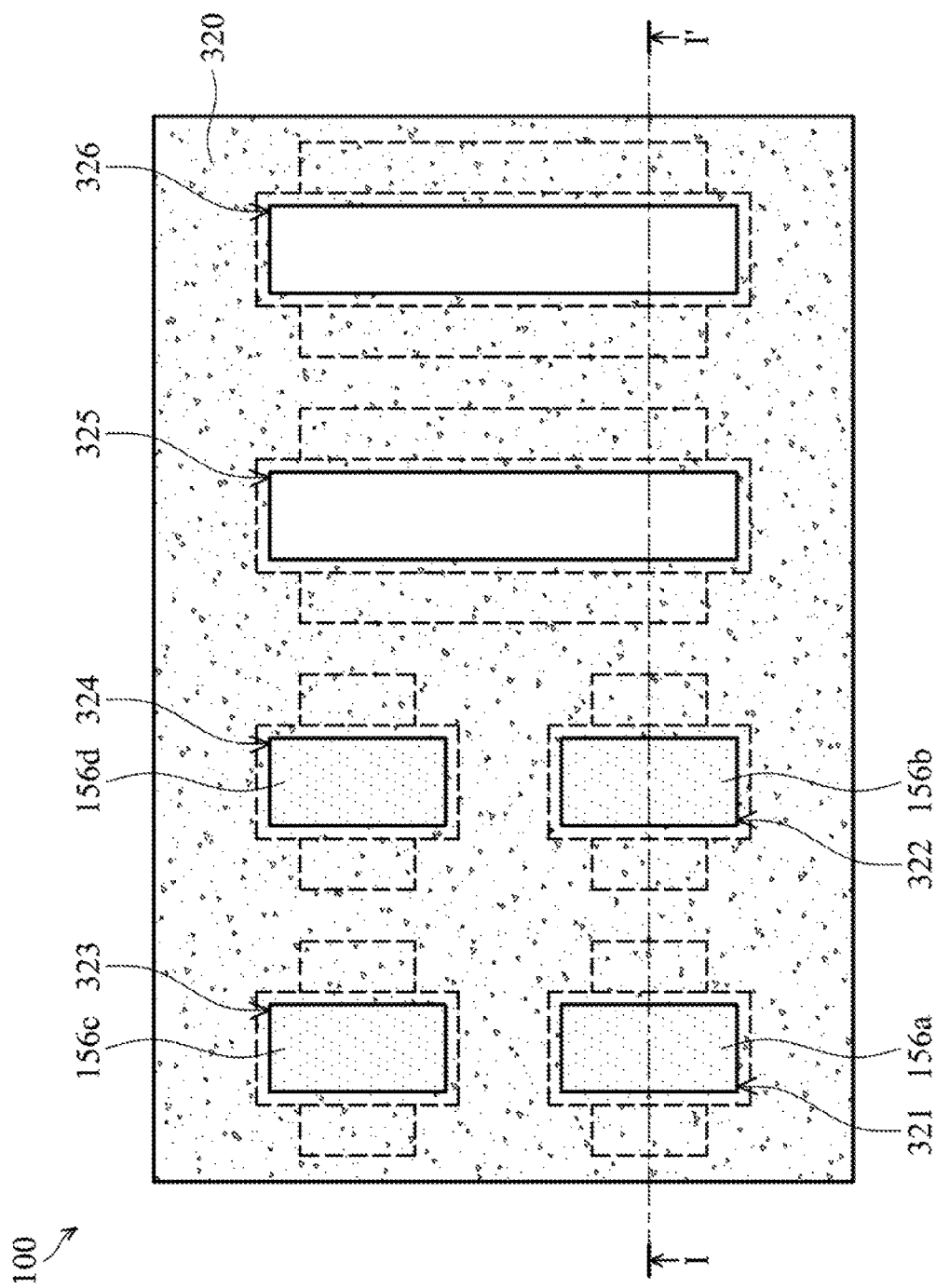
Figures 1, 3B:
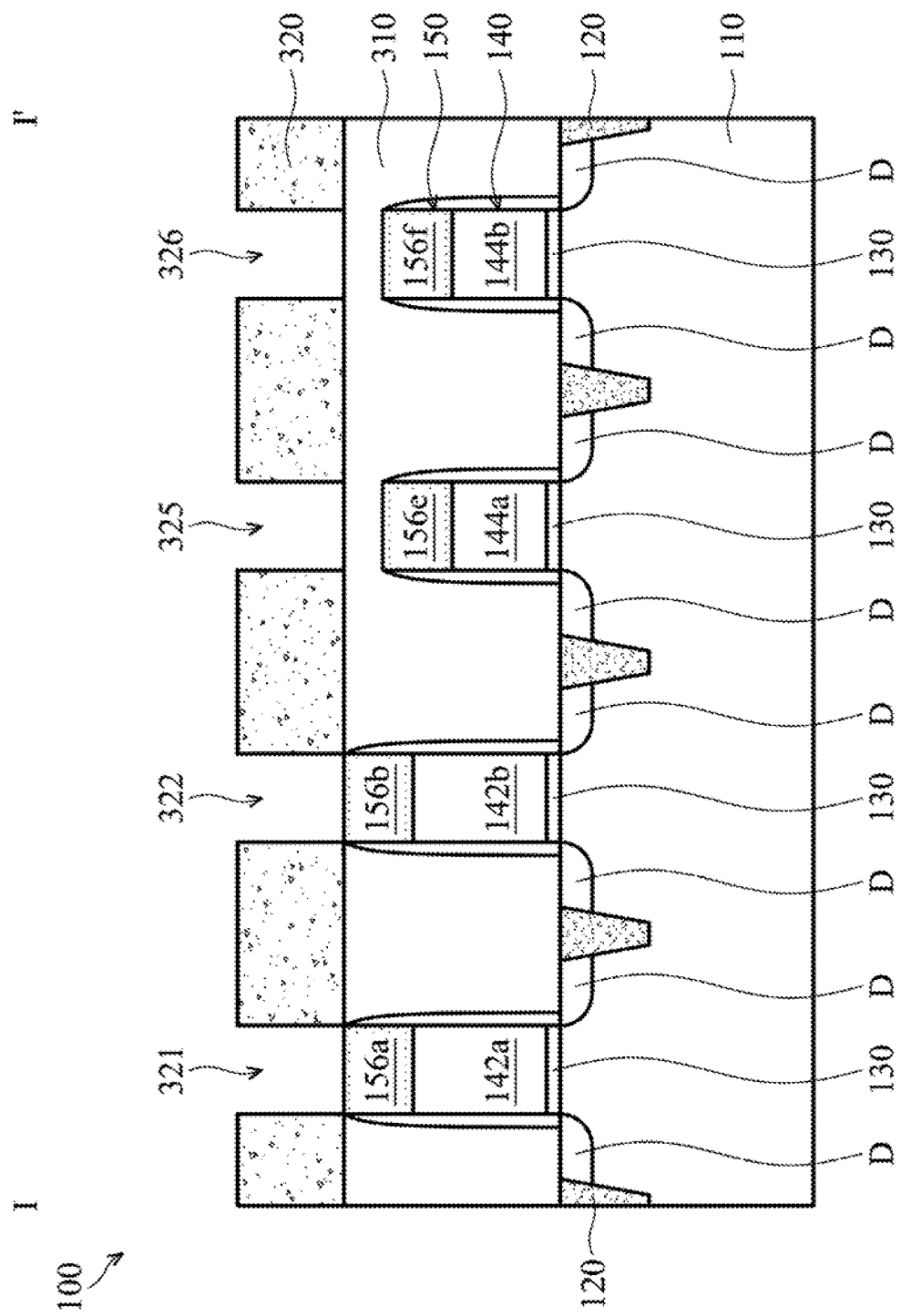
Figure 3C:
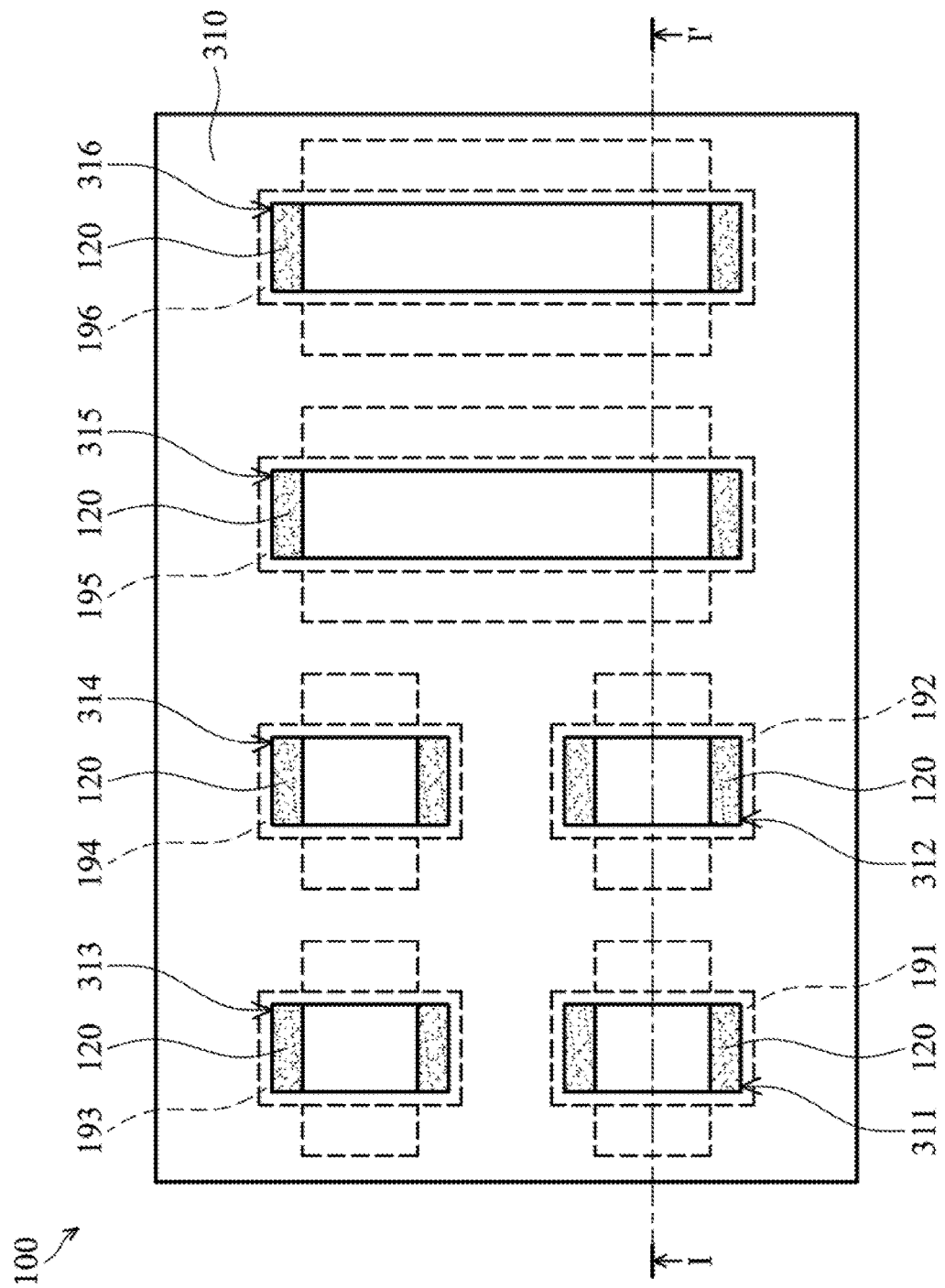
Figures 1, 3C:
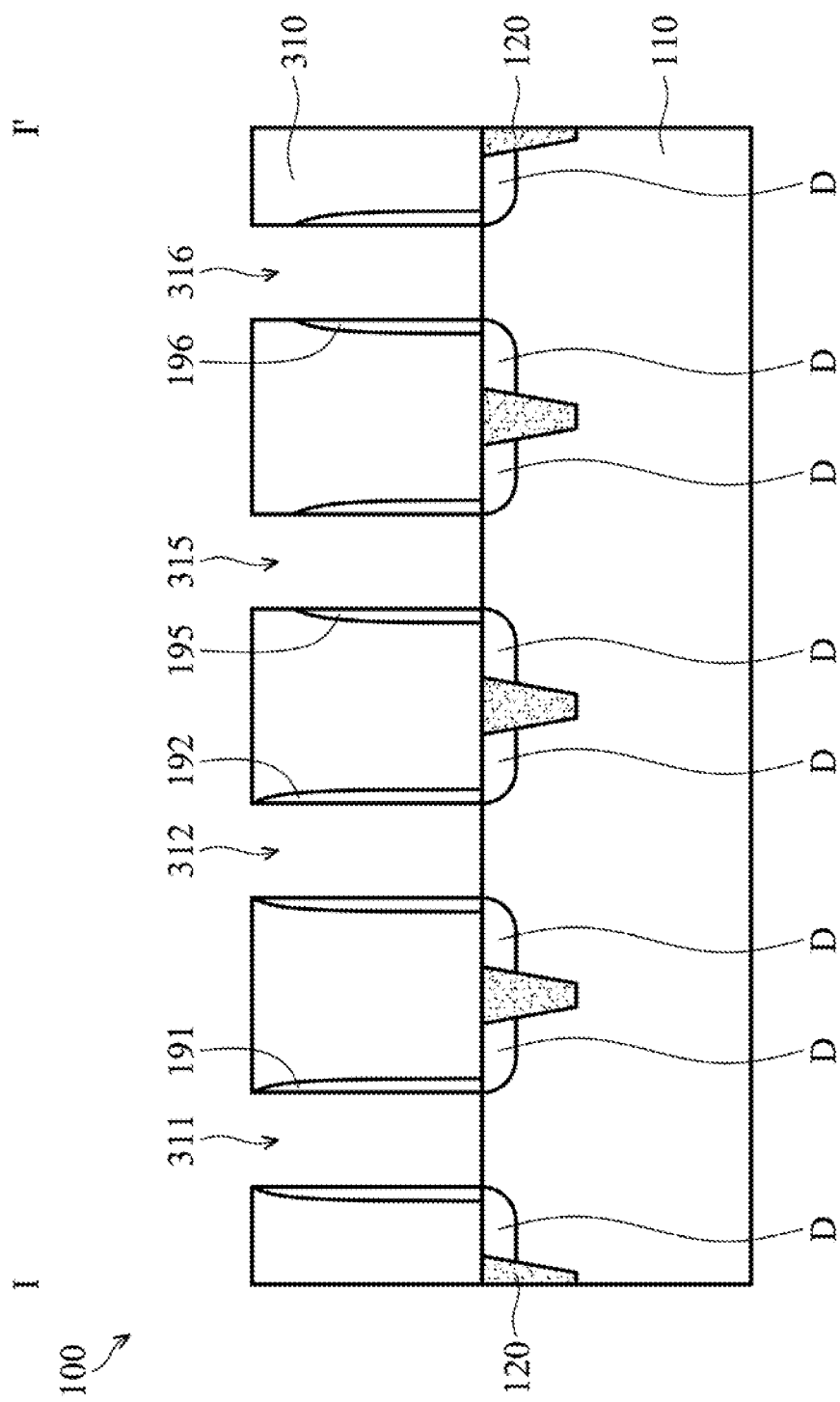
Figure 3D:
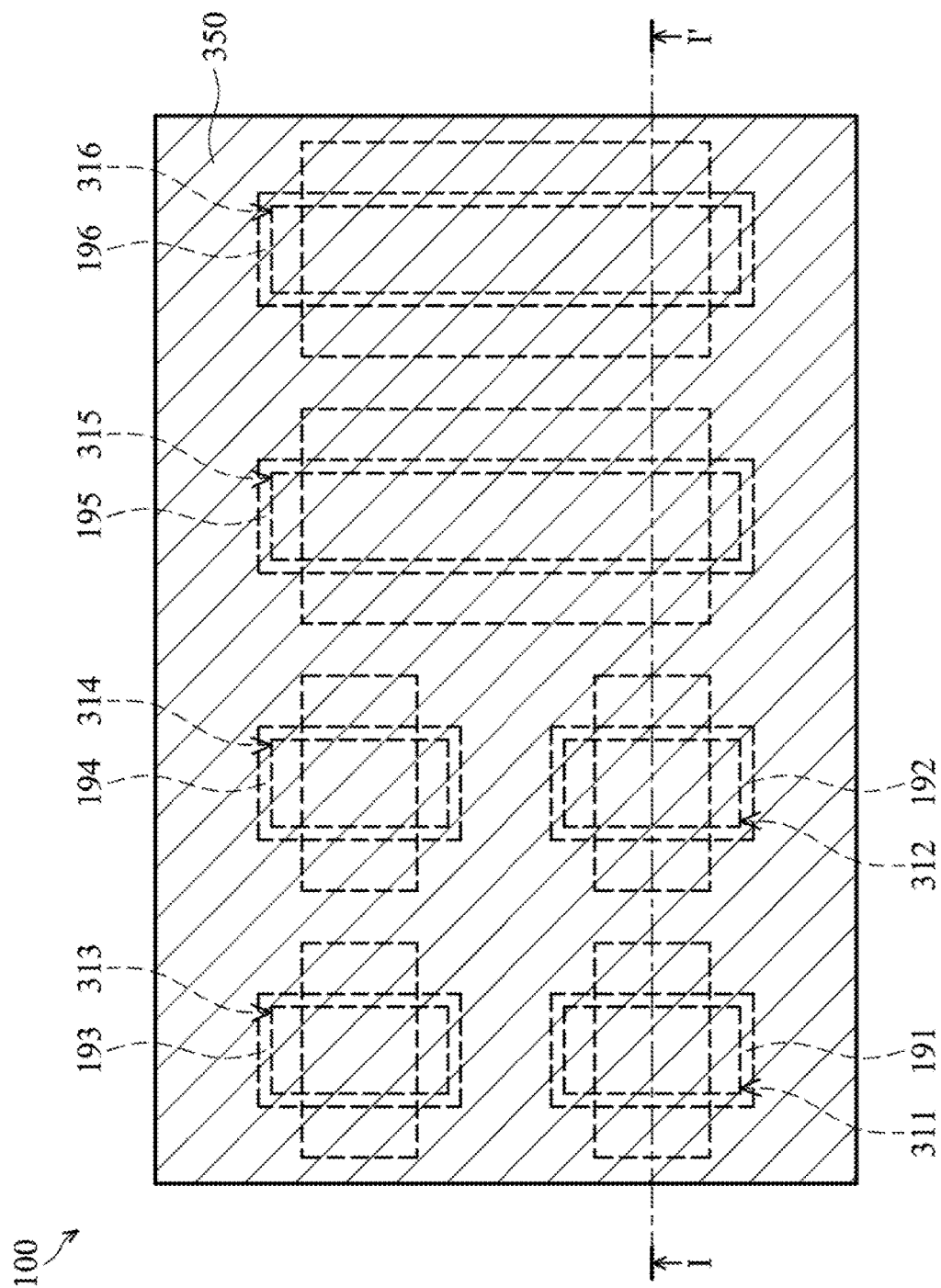
Figures 1, 3D:
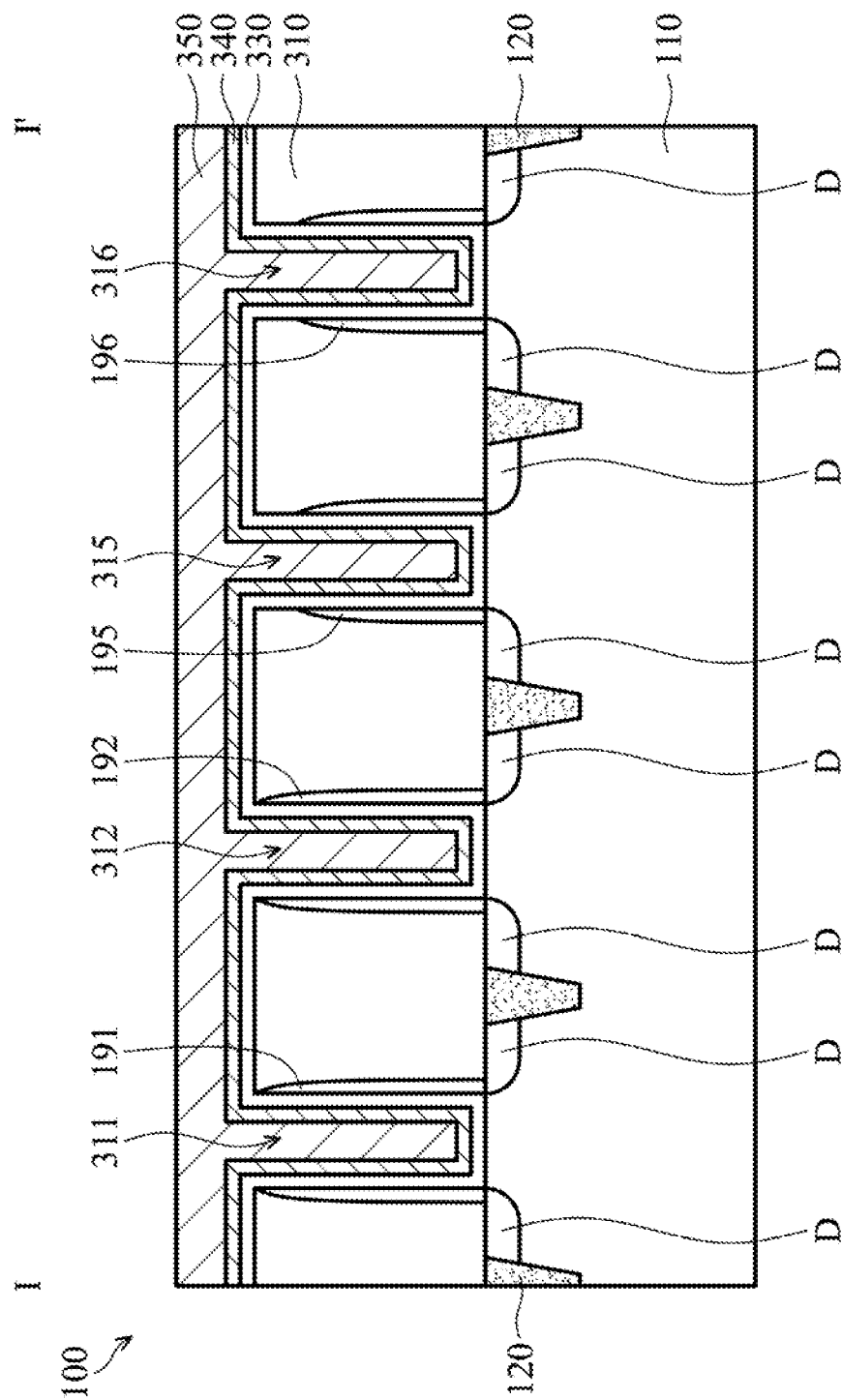
Figure 3E:
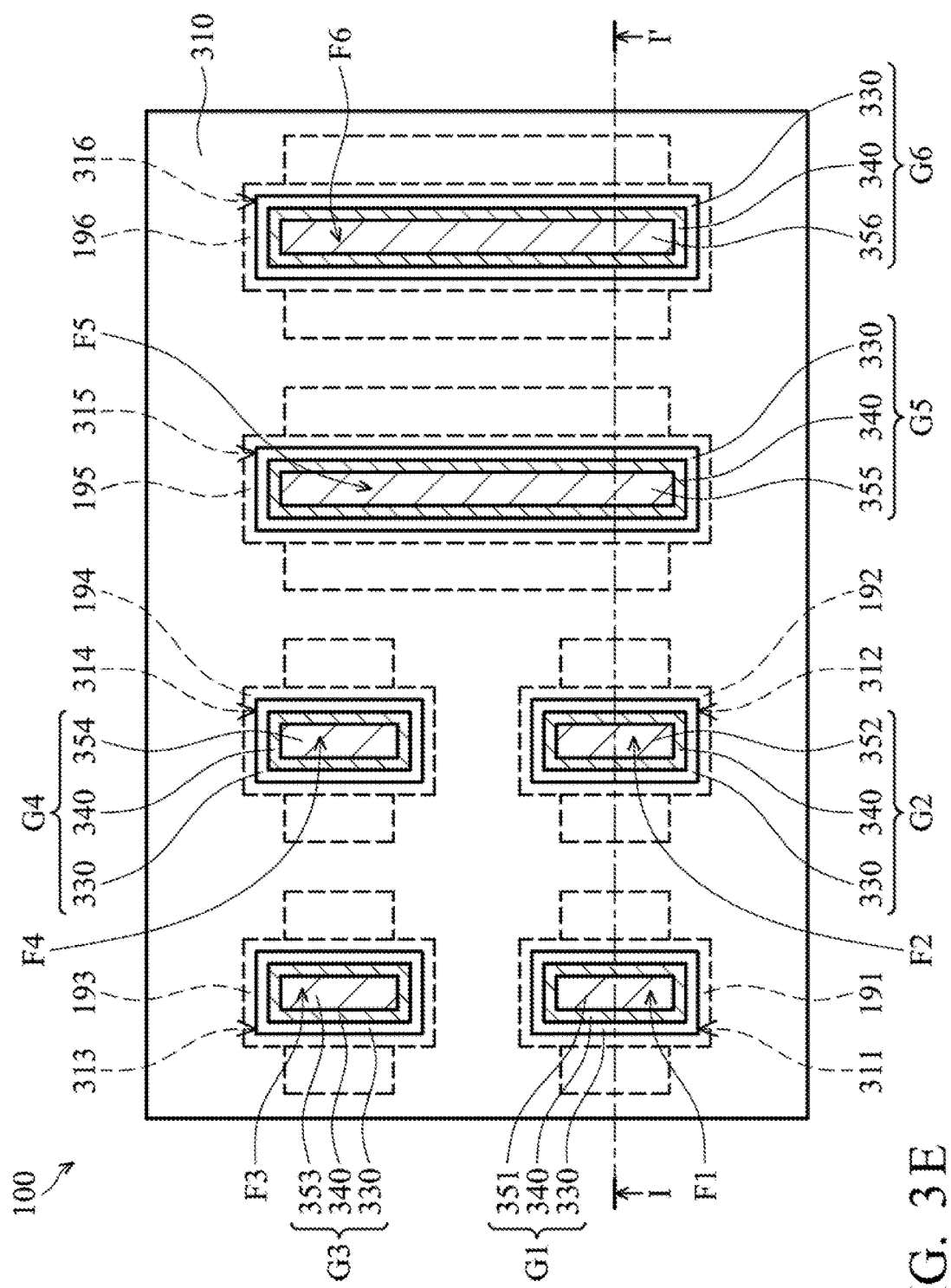
Figures 1, 3E:
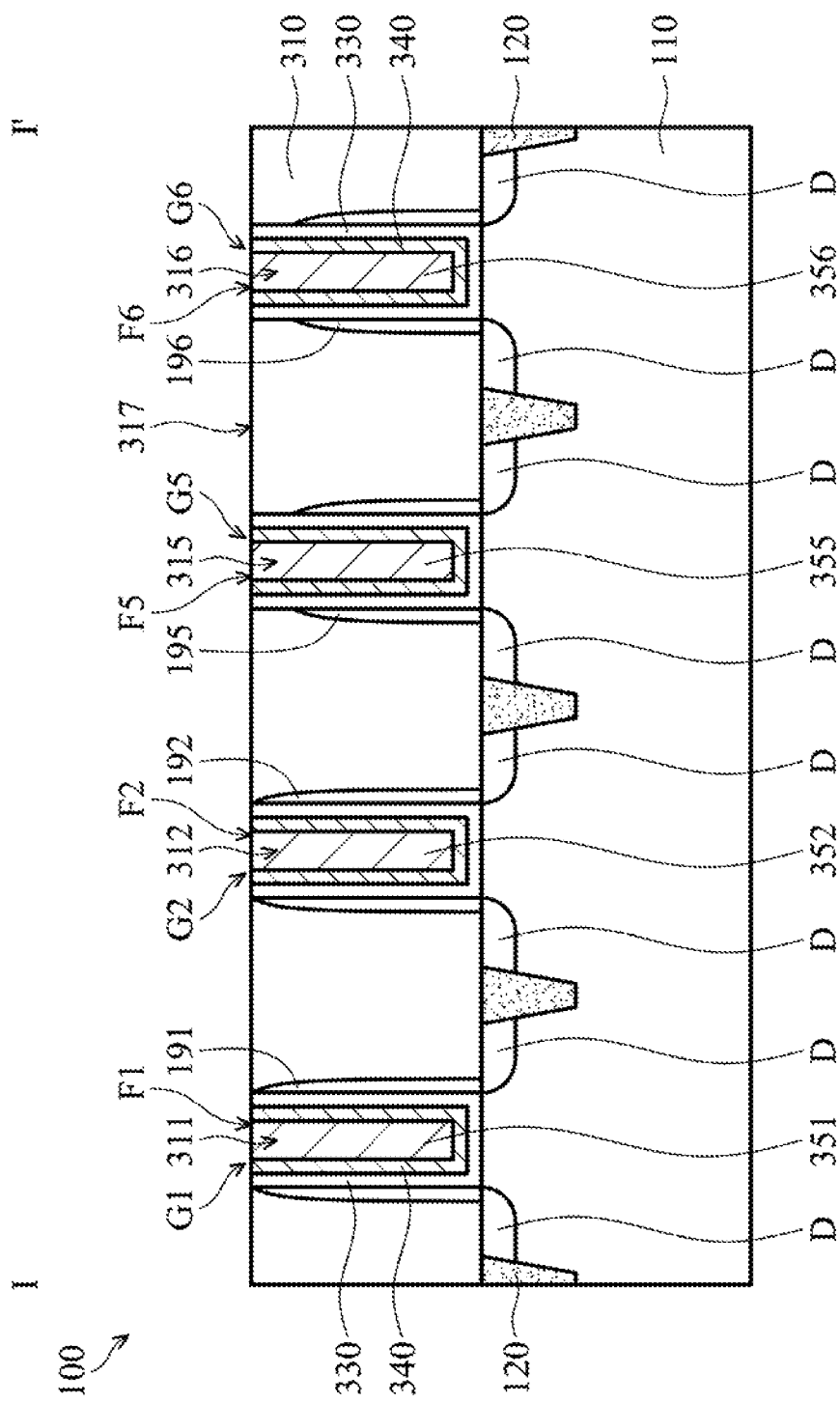
Figure 3F:
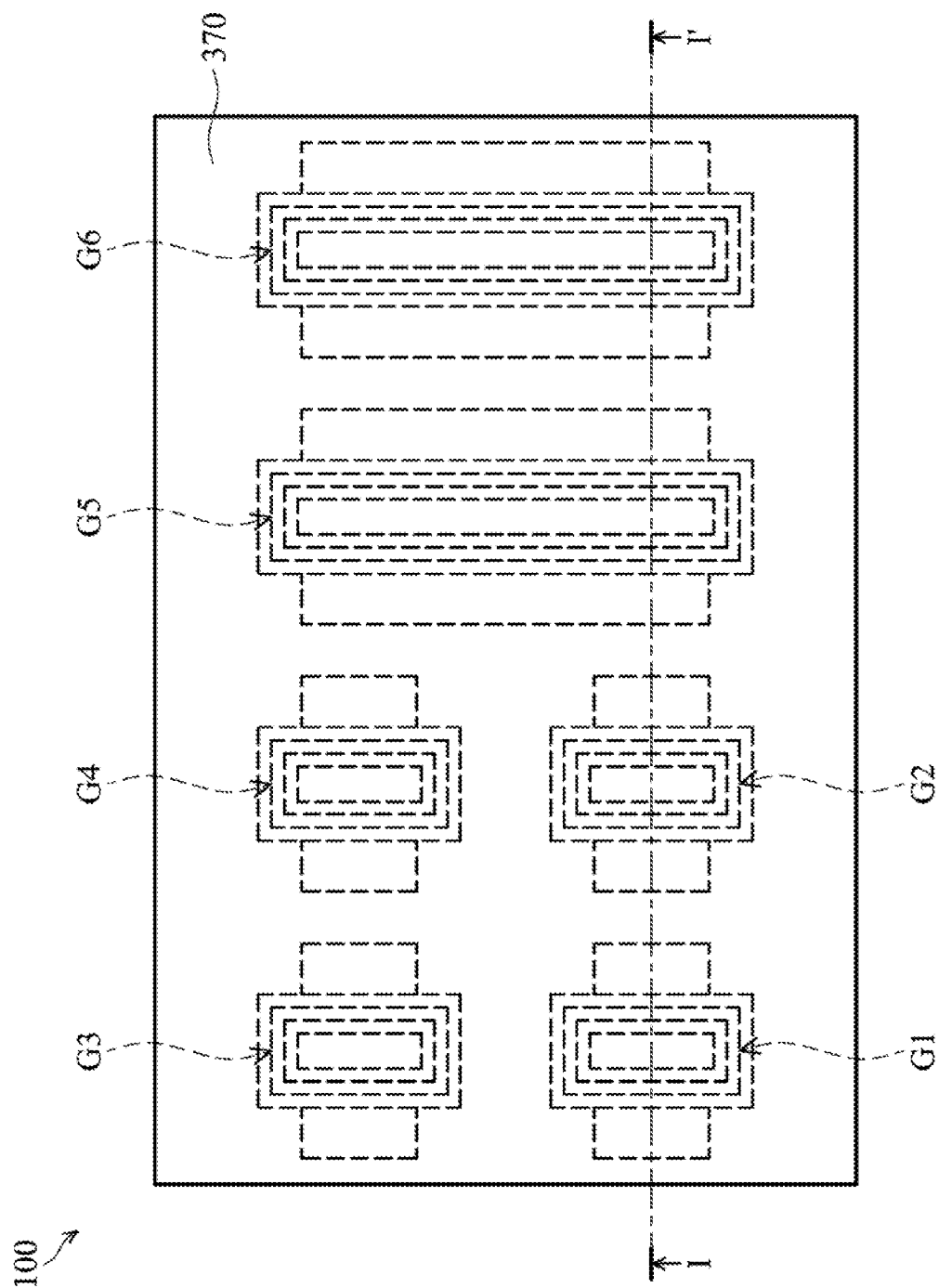
Figures 1, 3F:
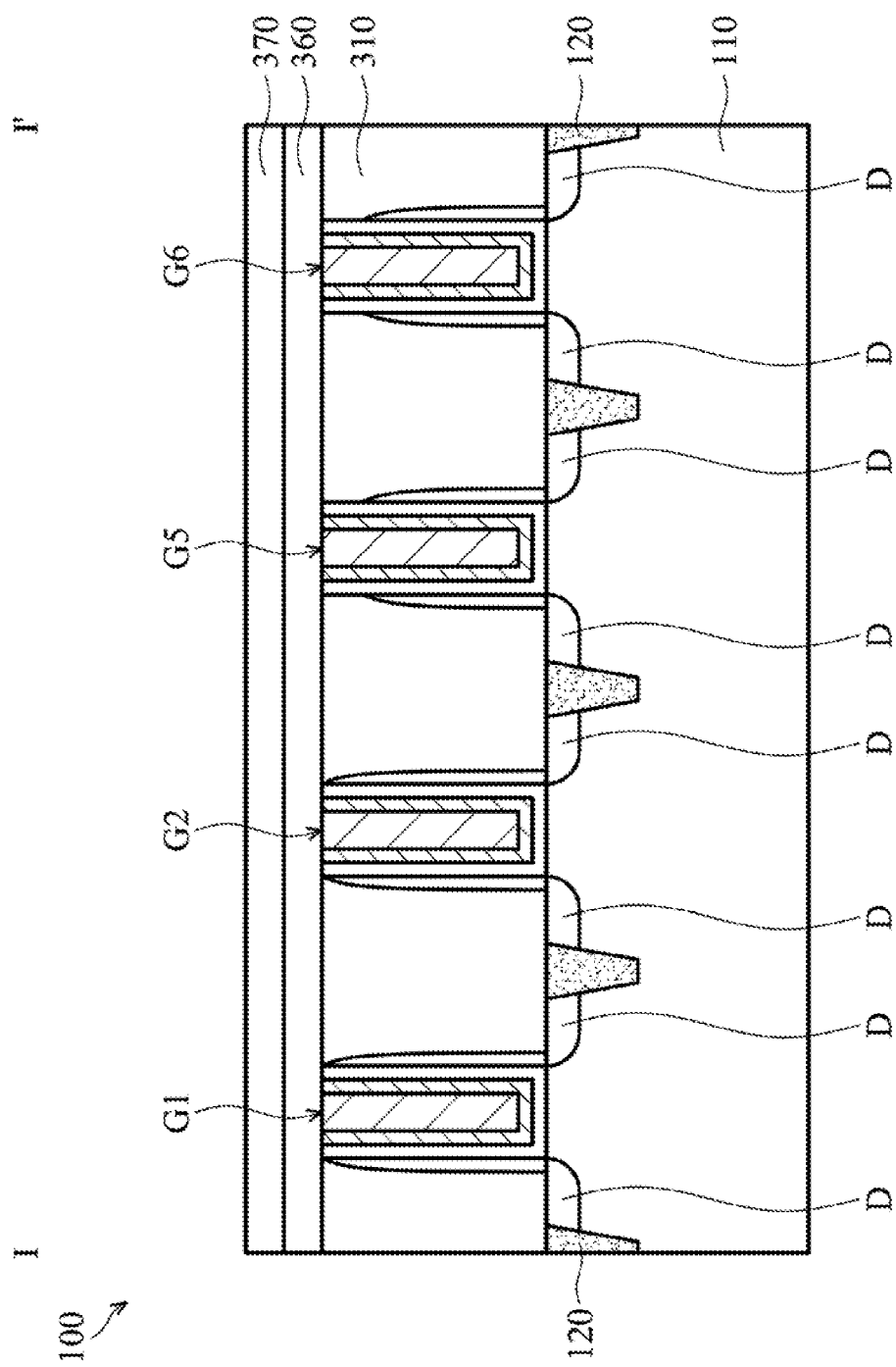
Figure 3G:
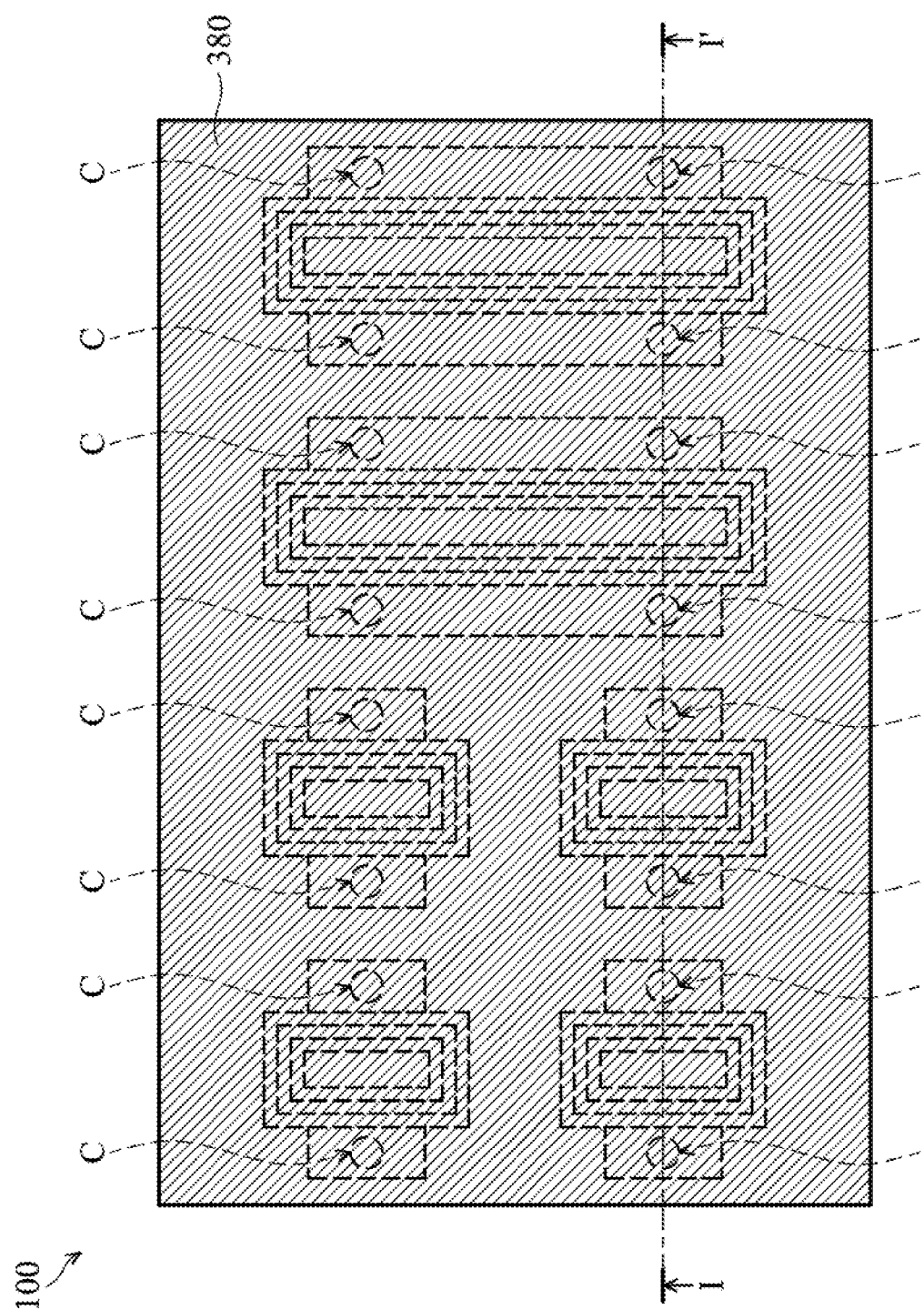
Figures 1, 3G:
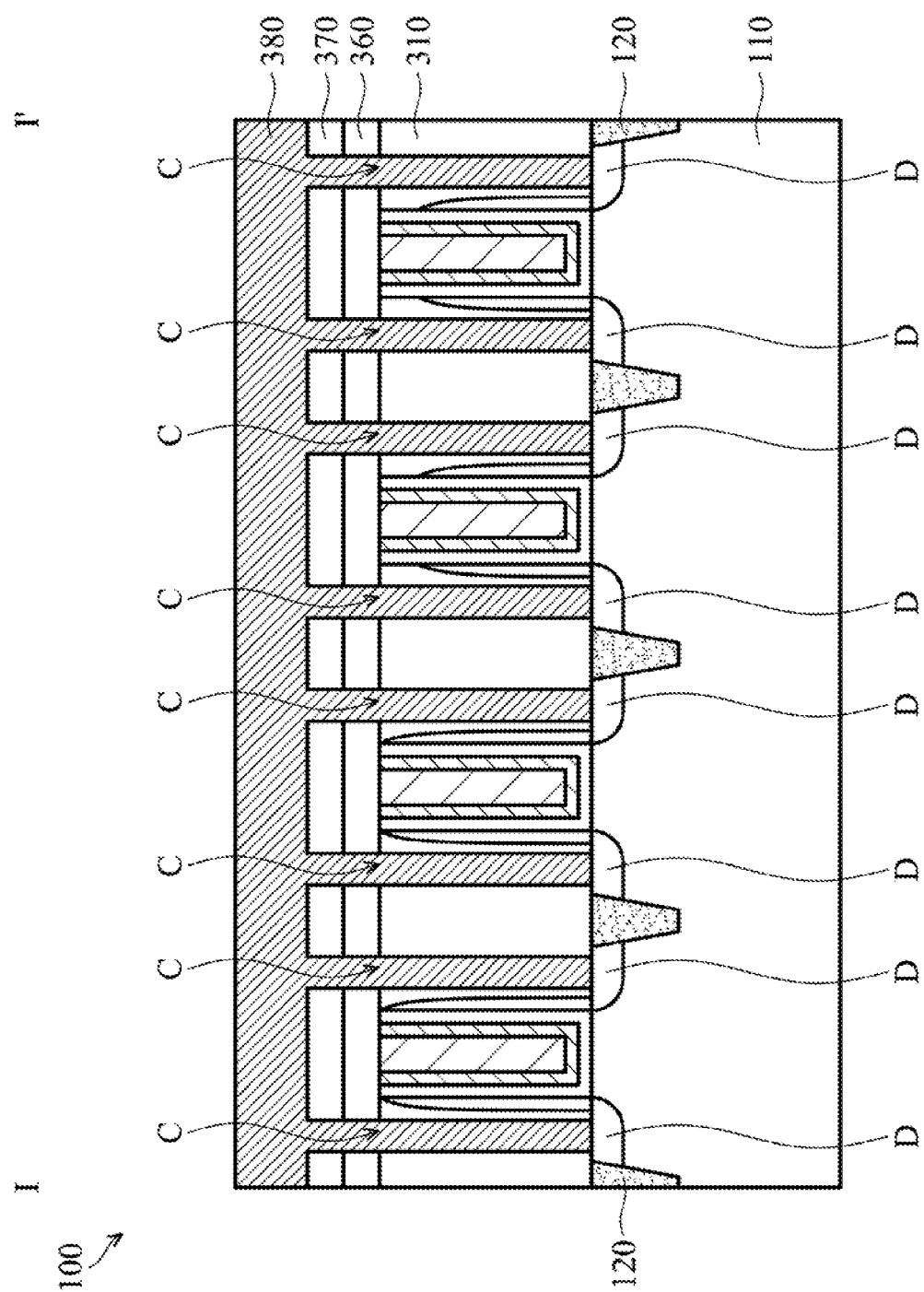
Figure 3H:
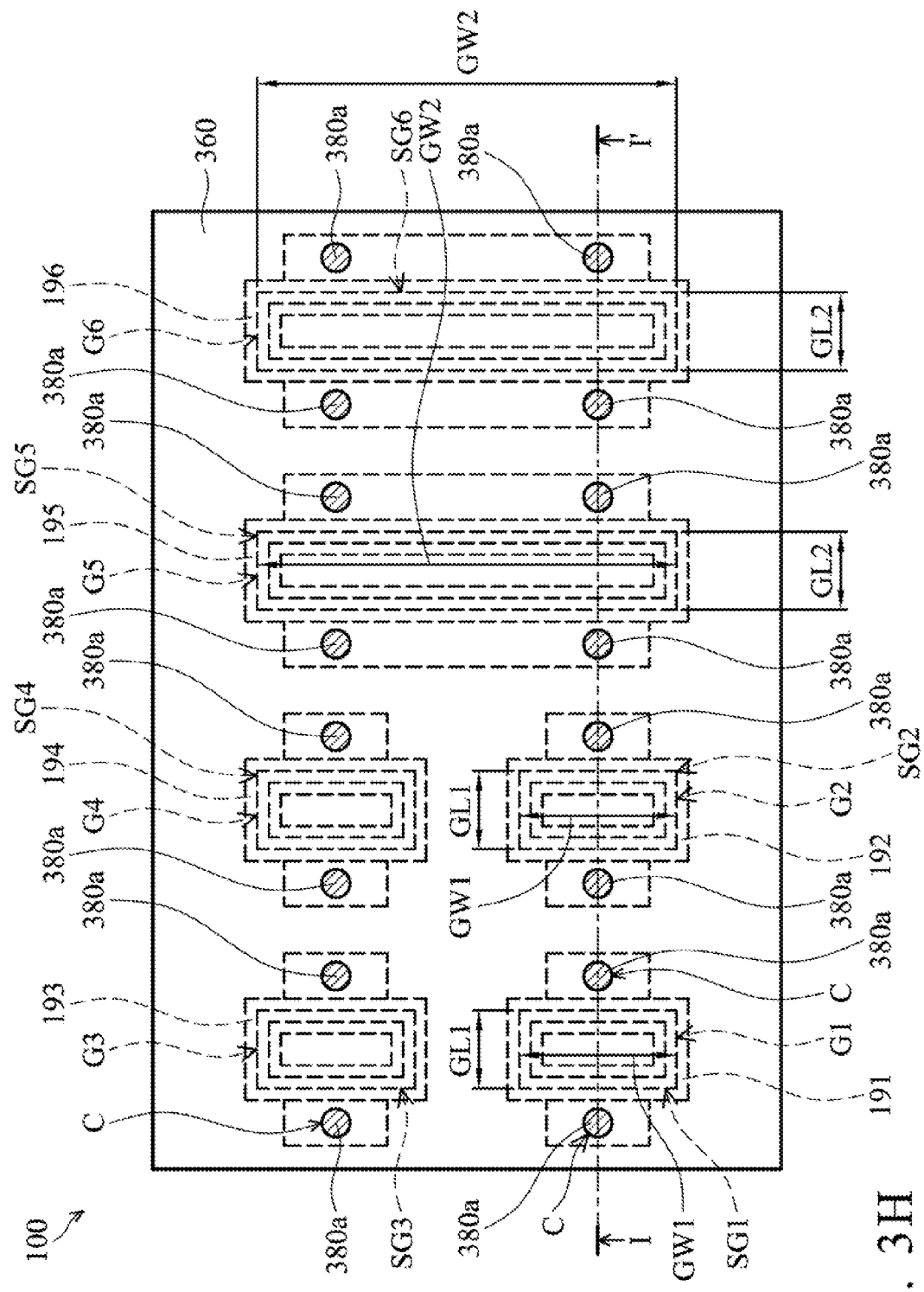
Figures 1, 3H:
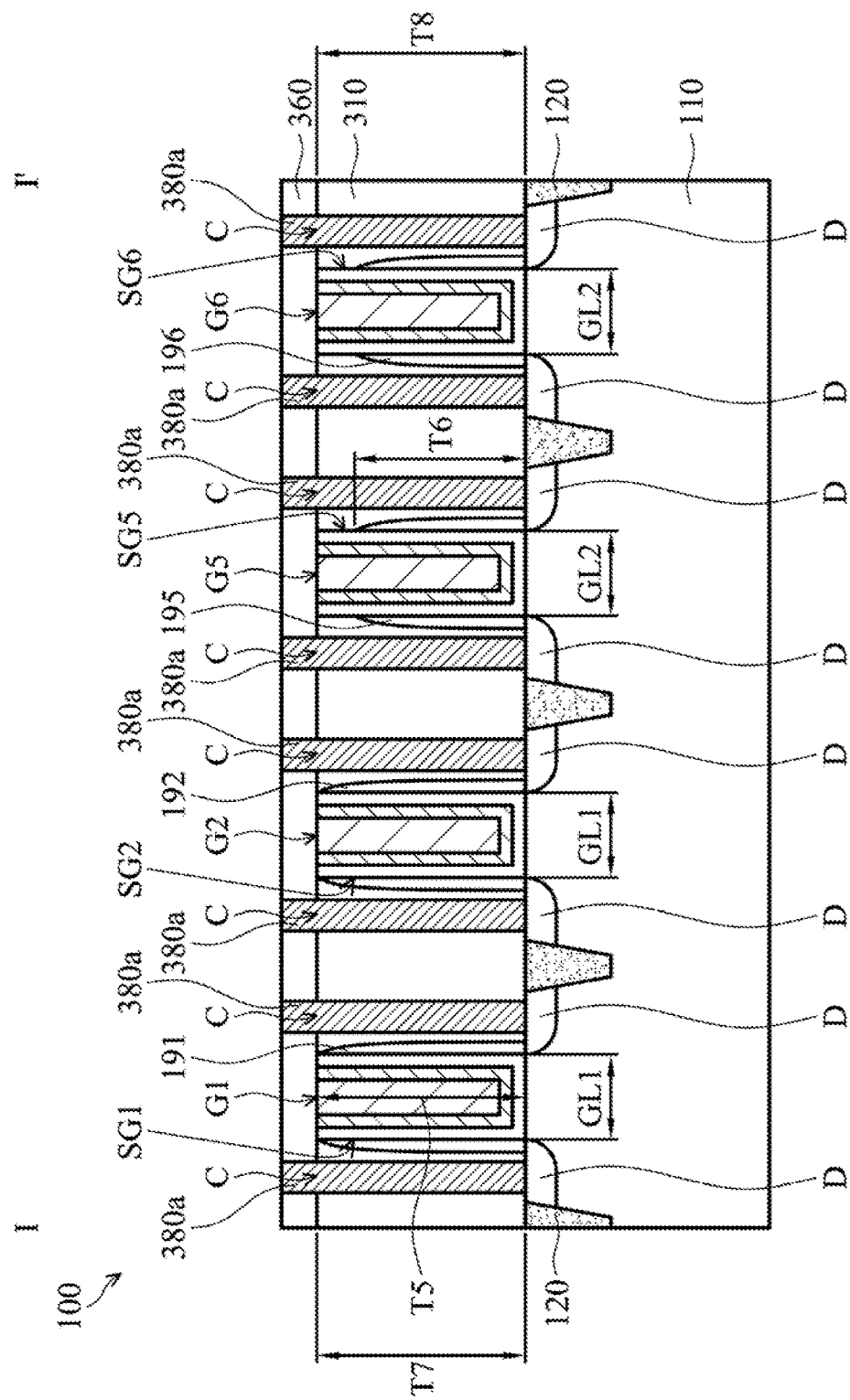

FIGS. 3A-3H are top views of various stages of a process for forming a semiconductor device structure 100, in accordance with some embodiments. FIGS. 3A-1 to 3H-1 are cross-sectional views illustrating a semiconductor device structure 100 along a sectional line I-I' in FIGS. 3A-3H respectively, in accordance with some embodiments.

As shown in FIGS. 3A and 3A-1, a dielectric layer 310 is formed over the substrate 110, the mask layer 150, and the spacers 191, 192, 193, 194, 195, and 196, in accordance with some embodiments. The dielectric layer 310 includes an insulating material, in accordance with some embodiments. The insulating material includes silicon oxide, borosilicate glass (BSG), phosphoric silicate glass (PSG), borophosphosilicate glass (BPSG), fluorinated silicate glass (FSG), low-k material, porous dielectric material, or a combination thereof, in accordance with some embodiments. The dielectric layer 310 is formed using a CVD process, a HDPCVD process, a spin-on process, a sputtering process, or a combination thereof, in accordance with some embodiments.

As shown in FIGS. 3B and 3B-1, a planarization process is then performed to the dielectric layer 310 until top surfaces of the strip portions 156a, 156b, 156c, and 156d are exposed, in accordance with some embodiments. The planarization process includes a chemical mechanical polishing (CMP) process, in accordance with some embodiments. After the planarization process is performed, the dielectric layer 310 has a substantially planar surface to facilitate subsequent process steps, in accordance with some embodiments.

As shown in FIGS. 3B and 3B-1, a mask layer 320 is formed over the dielectric layer 310, in accordance with some embodiments. The mask layer 320 has openings 321, 322, 323, 324, 325, and 326, in accordance with some embodiments. The openings 321, 322, 323, and 324 expose the strip portions 156a, 156b, 156c, and 156d, respectively, in accordance with some embodiments.

The openings 325 and 326 expose a portion of the dielectric layer 310 over the strip portions 156e and 156f, in accordance with some embodiments. The mask layer 320 includes silicon nitride (e.g., $Si_3N_4$), SiON, SiC, SiOC, or a combination thereof, in accordance with some embodiments. The mask layer 320 is formed using a deposition process and an etching process, in accordance with some embodiments.

As shown in FIGS. 3B, 3B-1, 3C, and 3C-1, the gate dielectric layer 130, the conductive layer 140, the mask layer 150, and a portion of the dielectric layer 310 are removed through the openings 321, 322, 323, 324, 325, and 326, in accordance with some embodiments.

After the removal process, openings 311, 312, 313, 314, 315, and 316 are formed in the spacers 191, 192, 193, 194, 195, and 196, respectively, in accordance with some embodiments. The openings 311, 312, 313, 314, 315, and 316 are trenches, in accordance with some embodiments. The removal process includes a wet etching process, a dry etching process, or a combination thereof, in accordance with some embodiments.

As shown in FIGS. 3D and 3D-1, a gate dielectric layer 330 is deposited over the dielectric layer 310 and sidewalls and bottoms of the openings 311, 312, 313, 314, 315, and 316, in accordance with some embodiments. The gate dielectric layer 330 is made of silicon oxide, silicon oxynitride, a combination thereof, or another suitable material.

In some embodiments, the gate dielectric layer 330 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments.

The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 330 is formed using a chemical vapor deposition process or another suitable process.

As shown in FIGS. 3D and 3D-1, a work function metal layer 340 is deposited over the gate dielectric layer 330, in accordance with some embodiments. The work function metal layer 340 provides a desired work function for transistors to enhance device performance including improved threshold voltage, in accordance with some embodiments.

In the embodiments of forming an NMOS transistor, the work function metal layer 340 can be an n-type metal capable of providing a work function value suitable for the device, such as equal to or less than about 4.5 eV. The n-type metal includes metal, metal carbide, metal nitride, or a combination thereof, in accordance with some embodiments. For example, the n-type metal is made of tantalum, tantalum nitride, or a combination thereof.

On the other hand, in the embodiments of forming a PMOS transistor, the work function metal layer 340 can be a p-type metal capable of providing a work function value suitable for the device, such as equal to or greater than about 4.8 eV. The p-type metal includes metal, metal carbide, metal nitride, another suitable material, or a combination thereof, in accordance with some embodiments. For example, the p-type metal is made of titanium, titanium nitride, another suitable material, or a combination thereof.

The work function metal layer 340 includes hafnium, zirconium, titanium, tantalum, aluminum, metal carbides, aluminides, ruthenium or a combination thereof, in accordance with some embodiments. The metal carbides include hafnium carbide or zirconium carbide, in accordance with some embodiments. The work function metal layer 340 is deposited by using a PVD process, CVD process, ALD process, plating process, another suitable method, or a combination thereof, in accordance with some embodiments.

As shown in FIGS. 3D and 3D-1, a gate electrode layer 350 is deposited over the work function metal layer 340 to fill the openings 311, 312, 313, 314, 315, and 316, in accordance with some embodiments, in accordance with some embodiments. The gate electrode layer 350 is also referred to as a metal gate electrode layer, in accordance with some embodiments.

The gate electrode layer 350 includes a suitable metal material, such as aluminum, tungsten, gold, platinum, cobalt, other suitable metal, alloy thereof, or a combination thereof, in accordance with some embodiments. The gate electrode layer 350 is deposited by using a PVD process, a CVD process, a plating process, the like, or a combination thereof, in accordance with some embodiments.

As shown in FIGS. 3E and 3E-1, a planarization process is performed to remove the gate electrode layer 350, the work function metal layer 340, and the gate dielectric layer 330 outside of the openings 311, 312, 313, 314, 315, and 316, in accordance with some embodiments. The gate electrode layer 350 remaining in the openings 311, 312, 313, 314, 315, and 316 forms gate structures 351, 352, 353, 354, 355, and 356, respectively, in accordance with some embodiments.

The gate structure 351, the work function metal layer 340, and the gate dielectric layer 330 in the opening 311 together form a gate stack G1, in accordance with some embodiments. The gate structure 352, the work function metal layer 340, and the gate dielectric layer 330 in the opening 312 together form a gate stack G2, in accordance with some embodiments.

The gate structure 353, the work function metal layer 340, and the gate dielectric layer 330 in the opening 313 together form a gate stack G3, in accordance with some embodiments. The gate structure 354, the work function metal layer 340, and the gate dielectric layer 330 in the opening 314 together form a gate stack G4, in accordance with some embodiments.

The gate structure 355, the work function metal layer 340, and the gate dielectric layer 330 in the opening 315 together form a gate stack G5, in accordance with some embodiments. The gate structure 356, the work function metal layer 340, and the gate dielectric layer 330 in the opening 316 together form a gate stack G6, in accordance with some embodiments.

The gate stacks G1, G2, G3, G4, G5, and G6 are surrounded by the dielectric layer 310, in accordance with some embodiments. After the planarization process, top surfaces F1, F2, F3, F4, F5, and F6 of the gate stacks G1, G2, G3, G4, G5, and G6 are aligned with each other and aligned with a top surface 317 of the dielectric layer 310, in accordance with some embodiments. The planarization process includes a chemical mechanical polishing (CMP) process or the like, in accordance with some embodiments.

As shown in FIGS. 3F and 3F-1, an etch stop layer 360 is deposited over the dielectric layer 310 and the gate stacks G1, G2, G3, G4, G5, and G6, in accordance with some embodiments. In some embodiments, the etch stop layer 360 is in direct contact with the gate stacks G1, G2, G3, G4, G5, and G6. The etch stop layer 360 is made of silicon nitride or another suitable material, in accordance with some embodiments.

As shown in FIGS. 3F and 3F-1, a protective layer 370 is formed over the etch stop layer 360, in accordance with some embodiments. The protective layer 370 is configured to protect the etch stop layer 360 from being damaged during subsequent processes, in accordance with some embodiments. The protective layer 370 includes, for example, a plasma-enhanced oxide (PEOX) layer.

As shown in FIGS. 3G and 3G-1, the protective layer 370, the etch stop layer 360, and the dielectric layer 310 are patterned to form contact openings C, in accordance with some embodiments. The contact openings C pass through the protective layer 370, the etch stop layer 360, and the dielectric layer 310 to expose the doped regions D, respectively, in accordance with some embodiments. A photolithography process and an etching process are used for patterning, in accordance with some embodiments.

As shown in FIGS. 3G and 3G-1, a conductive layer 380 is deposited over the protective layer 370 and is filled into the contact openings C to be electrically connected to the doped regions D, in accordance with some embodiments. The conductive layer 380 is formed by, for example, a PVD process or another suitable process. The conductive layer 380 is made of, for example, tungsten or another suitable conductive material.

As shown in FIGS. 3H and 3H-1, a chemical mechanical polishing (CMP) process is performed to remove the conductive layer 380 outside of the contact openings C and the protective layer 370, in accordance with some embodiments. After the CMP process, the conductive layer 380 remaining in the contact openings C forms contact structures 380a, in accordance with some embodiments.

The contact structures 380a pass through the etch stop layer 360 and the dielectric layer 310 to be electrically connected to the doped regions D (i.e. the S/D regions), in accordance with some embodiments. The contact structures 380a are also referred to as contact plugs, in accordance with some embodiments.

The semiconductor device structure 100 is an n-type metal-oxide-semiconductor field-effect transistor (MOSFET) or a p-type MOSFET, in accordance with some embodiments. The doped regions D are formed on opposite sides of each of the gate stack G1, G2, G3, G4, G5, or G6, in accordance with some embodiments. That is, each of the gate stack G1, G2, G3, G4, G5, or G6 is between the corresponding two doped regions D, in accordance with some embodiments.

Each of the gate stack G1, G2, G3, or G4 has the gate length GL1 and the gate width GW1, in accordance with some embodiments. Each of the gate stack G5 or G6 has the gate length GL2 and the gate width GW2, in accordance with some embodiments. The gate length GL1 is substantially equal to or close to the gate length GL2, in accordance with some embodiments. In some embodiments, a ratio of the difference between the gate lengths GL1 and GL2 to the gate length GL1 or GL2 ranges from about 0.1% to 2.5%. The gate width GW1 is less than the gate width GW2, in accordance with some embodiments.

Each of the gate stack G1, G2, G3, or G4 has the thickness T7, in accordance with some embodiments. Each of the gate stack G5 or G6 has the thickness T8, in accordance with some embodiments. The thickness T7 is substantially equal to or close to the thickness T8, in accordance with some embodiments.

The spacers 191, 192, 193, 194, 195, and 196 surround the gate stacks G1, G2, G3, G4, G5, and G6, respectively, in accordance with some embodiments. The thickness T5 of each of the spacer 191, 192, 193, or 194 is greater than the thickness T6 of each of the spacer 195 or 196, in accordance with some embodiments. The thickness T8 is greater than the thickness T6, in accordance with some embodiments.

The spacers 191, 192, 193, and 194 cover entire sidewalls SG1, SG2, SG3, and SG4 of the gate stacks G1, G2, G3, and G4, respectively, in accordance with some embodiments. The spacers 195 and 196 cover only a first portion of sidewalls SG5 and SG6 of the gate stacks G5 and G6, in accordance with some embodiments. That is, the spacers 195 and 196 expose a second portion of the sidewalls SG5 and SG6, in accordance with some embodiments.

In accordance with some embodiments, semiconductor device structures and methods for forming the same are provided. The methods (for forming the semiconductor device structure) form a conductive layer having a thick portion and a thin portion. The methods form a mask layer over the conductive layer. The mask layer has a first strip portion and a second strip portion, which is wider than the first strip portion. The first strip portion and the second strip portion are over the thick portion and the thin portion, respectively. The methods remove the conductive layer exposed by the mask layer to form a first gate structure and a second gate structure under the first strip portion and the second strip portion. The first gate structure and the second gate structure have similar or the same gate lengths. Therefore, critical dimension uniformity (or gate length uniformity) of the first and the second gate structures is improved. As a result, the uniformity of the drain saturation current (Idsat) is improved as well.

In accordance with some embodiments, a semiconductor device structure is provided. The semiconductor device structure includes a substrate having a first source region, a second source region, a first drain region, and a second drain region. The semiconductor device structure includes a first gate structure over the substrate and between the first source region and the first drain region. The semiconductor device structure includes a second gate structure over the substrate and between the second source region and the second drain region. A first thickness of the first gate structure is greater than a second thickness of the second gate structure. A first gate width of the first gate structure is less than a second gate width of the second gate structure.

In accordance with some embodiments, a semiconductor device structure is provided. The semiconductor device structure includes a substrate having a first source region, a second source region, a first drain region, and a second drain region. The semiconductor device structure includes a first gate stack over the substrate and between the first source region and the first drain region. The semiconductor device structure includes a second gate stack over the substrate and between the second source region and the second drain region. A first gate width of the first gate stack is less than a second gate width of the second gate stack. The semiconductor device structure includes a first spacer surrounding the first gate stack. The semiconductor device structure includes a second spacer surrounding the second gate stack. A first thickness of the first spacer is greater than a second thickness of the second spacer.

In accordance with some embodiments, a method for forming a semiconductor device structure is provided. The method includes forming a conductive layer over a substrate. The conductive layer has a first thick portion and a first thin portion, which is thinner than the first thick portion. The method includes forming a first mask layer over the conductive layer. The first mask layer has a first strip portion and a second strip portion. The second strip portion is wider than the first strip portion. The first strip portion is over the first thick portion. The second strip portion is over the first thin portion. The method includes performing a first anisotropic etching process to remove the conductive layer exposed by the first mask layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
a substrate having a first source region, a second source region, a first drain region, and a second drain region;
a first gate structure over the substrate and between the first source region and the first drain region, wherein the first gate structure has a first thickness, a first width, and a first length, wherein the first thickness is measured as a vertical length of polysilicon extending above a top surface of the substrate and the first length is measured as a distance of the first gate structure extending from the first source region to the first drain region, and wherein the first width is greater than the first length; and
a second gate structure over the substrate and between the second source region and the second drain region, wherein the second gate structure has a second thickness, a second width, and a second length, wherein the second thickness is measured as a vertical length of polysilicon extending above the top surface of the substrate and the second length is measured as a distance of the second gate structure extending from the second source region to the second drain region, and wherein the second width is greater than the second length;
a mask layer having a first portion and a second portion isolated from each other, wherein the first portion is over the first gate structure, and the second portion is over the second gate structure;
and
wherein the first thickness of the first gate structure is greater than the second thickness of the second gate structure, and a first gate width of the first gate structure is less than a second gate width of the second gate structure, and the first length and the second length are approximately equal.

2. The semiconductor device structure as claimed in claim 1, further comprising:
a first spacer surrounding the first gate structure and the first portion of the mask layer; and
a second spacer surrounding the second gate structure and the second portion of the mask layer.

3. The semiconductor device structure as claimed in claim 1, wherein a first top surface of the first portion is not aligned with a second top surface of the second portion.

4. The semiconductor device structure of claim 1, wherein the mask layer comprises at least one of silicon oxide, silicon nitride, silicon oxynitride (SiON), silicon carbide (SiC), or silicon oxycarbide (SiOC).

5. A semiconductor device structure, comprising:
a substrate having a first source region, a second source region, a first drain region, and a second drain region;
a first metal gate stack over the substrate and between the first source region and the first drain region, wherein the first metal gate stack includes a gate dielectric layer, a work function layer, and a gate electrode layer, wherein the first metal gate stack has a first thickness measured as a vertical distance above a top surface of the substrate to a top surface of the work function layer of the first metal gate stack;
a second metal gate stack over the substrate and between the second source region and the second drain region, wherein the second metal gate stack includes the gate dielectric layer, the work function layer, and the gate electrode layer, and wherein the second metal gate stack has a second thickness measured as a vertical distance above the top surface of the substrate to a top surface of the work function layer of the second metal gate stack, wherein the first and second thickness are substantially equal, and wherein a first gate width of the first metal gate stack is less than a second gate width of the second metal gate stack;
a first spacer surrounding the first metal gate stack and having a first thickness measured as a vertical distance from the top surface of the substrate; and
a second spacer surrounding a portion of the second metal gate stack and having a second thickness measured as a vertical distance from the top surface of the substrate, wherein the first thickness of the first spacer is greater than the second thickness of the second spacer, and wherein the work function layer of the second metal gate stack extends above the second spacer, and wherein the work function layer is one of an n-type metal or a p-type metal in both of the first and second metal gate stacks.

6. The semiconductor device structure as claimed in claim 5, wherein the first spacer covers an entire first sidewall of the gate dielectric layer of the first metal gate stack, and the second spacer covers only a first portion of a second sidewall of the gate dielectric layer of the second metal gate stack, a second portion of the second sidewall of the gate dielectric layer of the second metal gate stack interfaces with a dielectric material disposed over the gate dielectric layer.

7. The semiconductor device structure as claimed in claim 5, wherein the second thickness of the work function layer of the second metal gate stack is greater than the second thickness of the second spacer.

8. The semiconductor device structure as claimed in claim 5, wherein the top surface of the work function layer of the first metal gate stack is aligned with the top surface of the work function layer of the second metal gate stack and a top surface of the first spacer.

9. The semiconductor device structure as claimed in claim 5, wherein the second spacer exposes a portion of a second sidewall of the gate dielectric layer of the second metal gate stack.

10. The semiconductor device structure as claimed in claim 5, wherein a first gate length of the first metal gate stack is substantially equal to a second gate length of the second metal gate stack, wherein the first gate length is measured as a distance between the first source region and the first drain region and the second gate length is measured as a distance between the second source and the second drain regions.

11. The semiconductor device structure as claimed in claim 5, wherein the work function layer is the n-type metal, and wherein the work function layer is disposed directly on the gate dielectric layer and the gate electrode layer is disposed directly on the work function layer.

12. The semiconductor device structure as claimed in claim 5, wherein the work function layer is the p-type metal, and wherein the work function layer is disposed directly on the gate dielectric layer and the gate electrode layer is disposed directly on the work function layer.

13. A semiconductor device structure, comprising: a semiconductor device structure, comprising:
a substrate having a first source region, a second source region, a first drain region, and a second drain region;
a first gate stack over the substrate and between the first source region and the first drain region, wherein the first gate stack forms a gate of a first type of transistor, wherein the first type of transistor is one of an NMOS transistor or a PMOS transistor;

a second gate stack over the substrate and between the second source region and the second drain region, wherein a first gate width of the first gate stack is less than a second gate width of the second gate stack and wherein a third thickness of the first gate stack is substantially equal to a fourth thickness of the second gate stack, each of the third and fourth thicknesses defined as a vertical distance above a top surface of the substrate, wherein the second gate stack forms a gate of the first type of transistor;

a first spacer surrounding the first gate stack;

a second spacer surrounding the second gate stack; and a dielectric layer over the substrate, the first spacer and the second spacer and surrounding the first gate stack and the second gate stack, wherein the dielectric layer adjacent the first spacer and adjacent the second spacer and the first spacer each have a same first thickness, and the first thickness is greater than a second thickness of the second spacer, wherein the first and second thicknesses are defined as a vertical distance above the top surface of the substrate.

14. The semiconductor device structure as claimed in claim 13, wherein the first spacer covers an entire first sidewall of the first gate stack, wherein the first sidewall is defined as extending from the top surface of the substrate to a top surface of a work function metal layer of the first gate stack, and the second spacer covers only a portion of a second sidewall of the second gate stack, wherein the second sidewall is defined as extending from the top surface of the substrate to a top surface of the work function metal layer of the second gate stack.

15. The semiconductor device structure as claimed in claim 13, wherein the fourth thickness of the second gate stack is greater than the second thickness of the second spacer and wherein the fourth thickness is defined as a thickness of a work function metal layer over the second gate stack.

16. The semiconductor device structure as claimed in claim 13, wherein the second spacer exposes a portion of a second sidewall of the second gate stack, the exposed portion of the second sidewall defined by a gate dielectric layer of the second gate stack.

17. The semiconductor device structure as claimed in claim 16, wherein the gate dielectric layer interfaces the exposed portion of the second sidewall of the second gate stack.

18. The semiconductor device structure as claimed in claim 13, wherein each of the first gate stack and the second gate stack include a metal work function layer having a same type of metal, wherein the same type of metal is one of an n-type or a p-type.

19. The semiconductor device structure as claimed in claim 18, wherein each of the first gate stack and the second gate stack further include a metal electrode layer disposed over the metal work function layer.

* * * * *